(12) United States Patent
Liang et al.

(10) Patent No.: US 11,196,228 B2
(45) Date of Patent: Dec. 7, 2021

(54) ENCODED PIXEL STRUCTURE OF VERTICAL CAVITY SURFACE EMITTING LASER

(71) Applicant: Vertilite Co., Ltd., Jiangsu (CN)

(72) Inventors: Dong Liang, Sunnyvale, CA (US); Yijie Huo, Cupertino, CA (US); Song Liu, Menlo Park, CA (US)

(73) Assignee: Vertilite Co., Ltd., Jiangsu (CN)

( * ) Notice: Subject to any disclaimer, the term of this patent is extended or adjusted under 35 U.S.C. 154(b) by 0 days.

(21) Appl. No.: 16/386,041

(22) Filed: Apr. 16, 2019

(65) Prior Publication Data

US 2019/0341746 A1    Nov. 7, 2019

Related U.S. Application Data

(60) Provisional application No. 62/666,941, filed on May 4, 2018.

(30) Foreign Application Priority Data

Oct. 24, 2018    (CN) .............................. 201811244074

(51) Int. Cl.
*H01S 5/183*        (2006.01)
*H01S 5/028*        (2006.01)
(Continued)

(52) U.S. Cl.
CPC ........ *H01S 5/02257* (2021.01); *H01S 5/0282* (2013.01); *H01S 5/0608* (2013.01);
(Continued)

(58) Field of Classification Search
CPC ............. H01S 5/02296; H01S 2301/17; H01S 5/18361; H01S 5/423; H01S 3/19; H01S 3/00; H01S 5/02257; H01S 5/06
See application file for complete search history.

(56) References Cited

U.S. PATENT DOCUMENTS 6,185,240 B1    2/2001  Jiang et al.
10,153,614 B1 * 12/2018  Lin .......................... H01S 5/187
(Continued)

FOREIGN PATENT DOCUMENTS

CN         1241311 A       1/2000
CN         1507684 A       6/2004
(Continued)

OTHER PUBLICATIONS

China National Intellectual Property Office, First Office Action, CN Patent Application No. 201811244074.4, dated Dec. 7, 2018, 34 pages.
(Continued)

*Primary Examiner* — Tuan N Nguyen
(74) *Attorney, Agent, or Firm* — Fenwick & West LLP

(57) ABSTRACT

A pixel structure for a vertical cavity surface emitting laser has an emission window. The pixel structure includes a plurality of sub-pixels in the emission window. Bright-area sub-pixels emit light and dark-area sub-pixels having no light emission. The bright-area sub-pixels and the dark-area sub-pixels are arranged in a pattern in the emission window. Various patterns are possible. Different structures for implementing the sub-pixels are described.

18 Claims, 21 Drawing Sheets

(51) Int. Cl.
*H01S 5/06* (2006.01)
*H01S 5/42* (2006.01)
*H01S 5/02257* (2021.01)

(52) U.S. Cl.
CPC ...... *H01S 5/18311* (2013.01); *H01S 5/18361* (2013.01); *H01S 5/423* (2013.01); *H01S 2301/17* (2013.01)

(56) References Cited

U.S. PATENT DOCUMENTS

| | | | |
|---|---|---|---|
| 10,178,736 B2* | 1/2019 | Kondo | H01S 5/0264 |
| 10,411,437 B2* | 9/2019 | Lin | H01S 5/18333 |
| 10,700,493 B2* | 6/2020 | Lin | H01S 5/04256 |
| 2004/0114653 A1* | 6/2004 | Omori | H01S 5/18311 372/46.01 |
| 2004/0120376 A1* | 6/2004 | Kwak | H01S 5/18311 372/46.013 |
| 2007/0297750 A1* | 12/2007 | Bass | G02B 27/017 385/147 |
| 2009/0086170 A1* | 4/2009 | El-Ghoroury | H04N 9/3161 353/38 |
| 2010/0029030 A1* | 2/2010 | Uchida | H01S 5/423 438/34 |
| 2010/0309941 A1* | 12/2010 | Ito | H01S 5/4031 372/45.01 |
| 2011/0148328 A1* | 6/2011 | Joseph | F21K 9/00 315/312 |
| 2015/0187991 A1* | 7/2015 | McGroddy | H01L 33/30 257/13 |
| 2016/0352071 A1* | 12/2016 | Hogan | H01S 5/1835 |
| 2016/0377414 A1* | 12/2016 | Thuries | G02B 27/1093 356/625 |
| 2017/0261307 A1 | 9/2017 | Narumi et al. | |
| 2017/0353012 A1 | 12/2017 | Barve et al. | |

FOREIGN PATENT DOCUMENTS

| | | |
|---|---|---|
| CN | 1853322 A | 10/2006 |
| CN | 1855652 A | 11/2006 |
| CN | 101867153 A | 10/2010 |
| CN | 103107482 A | 5/2013 |
| CN | 106797107 A | 5/2017 |
| CN | 107196188 A | 9/2017 |
| EP | 0 488 772 A1 | 6/1992 |
| JP | H08-340156 A | 12/1996 |

OTHER PUBLICATIONS

China National Intellectual Property Office, Second Office Action, CN Patent Application No. 201811244074.4, dated Dec. 24, 2018, 16 pages.
United States Office Action, U.S. Appl. No. 16/386,048, dated Jan. 22, 2021, 12 pages.
United States Office Action, U.S. Appl. No. 16/386,048, dated Apr. 26, 2021, 13 pages.

* cited by examiner

ENCODED PIXEL STRUCTURE OF VERTICAL CAVITY SURFACE EMITTING LASER

CROSS-REFERENCE TO RELATED APPLICATION(S)

This application claims priority under 35 U.S.C. § 119(e) to U.S. Provisional Patent Application Ser. No. 62/666,941, "Encoded VCSEL array with digitized emission shapes," filed May 4, 2018. This application also claims priority to Chinese patent application no. 201811244074, patent ZL 201811244074.4, publication number CN 108923261 B, filed on Oct. 24, 2018. The subject matter of all of the foregoing is incorporated herein by reference in their entirety.

BACKGROUND

1. Technical Field

The present invention relates to the field of vertical cavity surface emitting lasers and manufacturing thereof, and more particularly to a pixel structure, a pixel array and a method for fabricating them.

2. Description of Related Art

The Vertical Cavity Surface Emitting Laser (VCSEL) is based on GaAs semiconductor materials and is different from other light sources such as LEDs and laser diodes. Due to advantages such as circular output spot, single longitudinal mode output, small threshold current, low price, easy integration into a large area array, etc., VCSELs are widely used in optical communication, optical interconnection, optical storage 3D sensing and other fields.

The extremely short optical cavity in VCSEL, results in a large longitudinal mode spacing, which can be wide. Single longitudinal mode operation in the temperature range, high dynamic modulation frequency, cavity volume reduction makes its spontaneous emission factor several orders of magnitude higher than that of ordinary end-face emission lasers, which leads to many physical properties being greatly improved. Reduced development costs, vertical substrate in the light-emitting direction, easy integration of high-density two-dimensional arrays for higher power output, and because multiple lasers can be arranged in parallel in the direction perpendicular to the substrate, make it good for applications such as parallel optical transmission and parallel optical interconnects. It has been successfully applied to single-channel and parallel light at unprecedented speeds. With its high performance-price ratio, it has been widely used in broadband Ethernet and high-speed data communication networks. In addition, its manufacturing process is compatible with light-emitting diodes (LEDs), and the cost of large-scale manufacturing could be very low.

In terms of fiber-optic communication, the VCSEL market is currently developing at an unprecedented rate, and the replacement of high-priced LEDs in North America for the construction of Gigabit and 10 Gigabit Ethernet data communication networks has led to an explosive growth in the demand for high-speed VCSEL transceiver modules. VCSEL also has good application prospect in other aspects. In terms of optical printing, the electronicization of optical scanning technologies such as polygonal mirrors in laser printers has been a problem that has not been solved for many years, and has gradually improved with the development of technology. If LED arrays are used, power consumption is a bottleneck. The introduction of VCSEL arrays can solve this problem. Multiple beams in the form of an array of thousands of VCSELs may be a good way to replace polygonal mirror scanning. Compared to a single laser tube in the past, the VCSEL's array-integrated structure allows simultaneous multi-line scanning. This can greatly increase the scanning speed of the laser printer and extend its service life accordingly. In terms of light display, the usual displays are constructed using red, green, and blue ternary color light tubes. If lasers with red, green, and blue ternary colors are fabricated, they can be used in the technical field of large displays. In terms of illumination, VCSEL's electro-optic conversion efficiency is more than 35%. If its wavelength covers from the ultraviolet range to the visible region, it can be expected to have a wide application prospect in the field of illumination, achieving white light illumination, for example, indoor lighting that adjusts light intensity, backlights for laptops, traffic lights, and outdoor lighting. In addition, there are also prospects for application in gas detection and high-density optical storage.

A VCSEL array is characterized in that laser projection is performed by arranging VCSEL point sources on a small substrate, such as arranging VCSEL point sources on a semiconductor substrate. The VCSEL point sources generally correspond to one bit or one pixel per emission window of a VCSEL device, which is typically shaped as a simple circular or square hole, so one emission window can only carry one bit of information. The VCSEL array, together with optical lenses or optical diffraction elements, can realize the projection function. This kind of projection light source actually realizes the projection of the image by sacrificing a certain point light source. These sacrificial point light sources are only occluded during the projection process to form an image, which still causes a serious waste of energy. In addition, the VCSEL point source as the VCSEL source array must form an image, and must be matched with other VCSEL point sources adjacent to the VCSEL point source. If one or more of the VCSEL point sources are damaged, the entire projected image may be defective.

Thus, there is a need to provide a pixel structure, a pixel array, and a fabrication method thereof for a vertical cavity surface emitting laser that can effectively save energy, reduce cost, and carry more information.

SUMMARY

In view of the above-mentioned shortcomings of the prior art, one aspect of the present invention is to provide a pixel structure of a vertical cavity surface emitting laser and a manufacturing method thereof, which are used to improve information density of a VCSEL array.

One aspect of the present invention provides a pixel structure for a vertical cavity surface emitting laser having an emission window. The pixel structure includes a plurality of sub-pixels in the emission window. Bright-area sub-pixels emit light and dark-area sub-pixels having no light emission. The bright-area sub-pixels and the dark-area sub-pixels are arranged in a pattern in the emission window.

In some embodiments, the bright-area sub-pixels and the dark-area sub-pixels are arranged in a matrix pattern within the emission window.

In some embodiments, the bright-area sub-pixels and the dark-area sub-pixels are arranged in the emission window as one of a digital pattern, a text pattern and a letter pattern.

In some embodiments, the bright-area sub-pixels and the dark-area sub-pixels are arranged in a two-dimensional code pattern in the emission window.

In some embodiments, the pattern comprises a plurality of strip-shaped bright-area sub-pixels separated by the dark-area sub-pixels.

In some embodiments, the pattern comprises a plurality of first strip-shaped bright-area sub-pixels and a plurality of second strip-shaped bright-area sub-pixels. The length of the second strip of bright-area sub-pixels is greater than the length of the first strip of bright-area sub-pixels. Between the strip-shaped bright-area sub-pixels, between the second strip-shaped bright-area sub-pixels, and between the first strip-shaped bright-area sub-pixel and the second strip-shaped bright-area sub-pixel are filled by dark-area sub-pixels.

In some embodiments, the pattern comprises a Pa Kua (Eight Trigram) array comprising one or two of the second strip-shaped bright-area sub-pixels and one or two sets of first strip-shaped bright-area sub-pixels. Further, the length of the first strip of bright-area sub-pixels is between 3 micrometers and 10 micrometers, and the width is between 3 micrometers and 10 micrometers. The length of the second strip of bright-area sub-pixels is between 10 micrometers and 30 micrometers and the width is between 3 micrometers and 10 micrometers. The dark region sub-pixels have a width of between 2 micrometers and 15 micrometers.

In some embodiments, the dark region sub-pixel is defined in the vertical cavity surface emitting laser by a patterned trench and an oxide layer extending from the sidewall of the trench toward the vertical cavity surface emitting laser. The trench and the confinement oxide layer are used to block a current path of the vertical cavity surface emitting laser of a corresponding region to form the dark region sub-pixel.

In some embodiments, the vertical cavity surface emitting laser comprises a lower mirror, an active layer on the lower mirror, an upper mirror on the active layer, a trench and a limiting oxide layer, the trench being patterned formed by removing the lower mirror, the active layer and the upper mirror, the confinement oxide layer is formed in such a manner as to oxidize from inside the trench sidewall toward the vertical cavity surface emitting laser.

In some embodiments, the dark region sub-pixel has a minimum width of 6 microns.

In some embodiments, the dark region sub-pixel is defined in the vertical cavity surface emitting laser by a patterned ion passivation layer for cutting the vertical cavity surface emitting laser of the corresponding region. The current path forms a dark-area sub-pixel.

In some embodiments, the vertical cavity surface emitting laser comprises a lower mirror, an active layer on the lower mirror, an upper mirror on the active layer, and an ion passivation layer, the ion passivation layer being blunt. A method of ion implantation is formed in the lower mirror and the active layer or the upper mirror and the active layer.

In some embodiments, the dark region sub-pixel has a minimum width of 5 microns.

In some embodiments, the dark region sub-pixel is defined in the vertical cavity surface emitting laser by a patterned metal masking layer for masking light of the vertical cavity surface emitting laser of the corresponding region.

In some embodiments, the vertical cavity surface emitting laser comprises a lower mirror, an active layer on the lower mirror, an upper mirror on the active layer, and a metal masking layer. The metal masking layer is deposited by metal and a patterning etch is formed on the surface of the upper mirror.

In some embodiments, the dark region sub-pixel has a minimum width of 2 microns.

In some embodiments, the dark region sub-pixel is defined in the vertical cavity surface emitting laser by a patterned high threshold reflection layer for improving light emission of the vertical cavity surface emitting laser. The required current intensity is such that the vertical cavity surface emitting laser of the corresponding region of the high threshold reflective layer does not have light exiting, thus forming a dark region sub-pixel.

In some embodiments, the vertical cavity surface emitting laser comprises a lower mirror, an active layer on the lower mirror, and an upper mirror on the active layer, the surface relief structure being located under the lower mirror or in the upper mirror.

In some embodiments, the dark region sub-pixel has a minimum width of 2 microns.

Another aspect of the present invention provides a pixel array of a vertical cavity surface emitting laser comprising a plurality of pixel structures of vertical cavity surface emitting lasers arranged in an array to form a pattern array.

In some embodiments, the pattern array comprises pattern information of a pixel structure of the vertical cavity surface emitting laser and position information of a pixel structure of the vertical cavity surface emitting laser.

Another aspect of the present invention provides an optical assembly comprising the pixel structure of the vertical cavity surface emitting laser described above and an optical lens disposed on the pixel structure to achieve an enlarged projection of the pattern.

Another aspect of the present invention also provides an optical component comprising the above-described pixel structure of a vertical cavity surface emitting laser, an optical lens disposed on the pixel structure, and an optical diffraction element disposed on the optical lens to implement the pattern using magnified projection and copy reproduction, to achieve enlarged projection of the pattern and reproduction.

Another aspect of the present invention also provides an optical assembly comprising the pixel array of the vertical cavity surface emitting laser described above and an optical lens disposed on the pixel array to achieve an enlarged projection of the pattern array.

Another aspect of the present invention also provides an optical component comprising the above-described pixel array of a vertical cavity surface emitting laser, an optical lens disposed on the pixel array, and an optical diffraction element disposed on the optical lens to implement the pattern by magnified projection of the array and copy reproduction.

Another aspect of the invention also provides a method for fabricating a pixel structure of a vertical cavity surface emitting laser, comprising the steps of: 1) forming a lower mirror of a vertical cavity surface emitting laser, an active layer and an upper mirror, and defining an emission window of the vertical cavity surface emission laser; and 2) forming a pixel structure in an emission window of the vertical cavity surface emitting laser, the pixel structure including a plurality of bright-area sub-pixels having light emission and a plurality of dark-area sub-pixels not having light exiting, and the bright-area sub-pixels and the dark-area sub-pixels are arranged in a pattern within the emission window.

In some embodiments, step 2) comprises: 2-1) etching a patterned trench in the lower mirror, the active layer and the upper mirror, the trench revealing the vertical cavity surface emitting laser 2-2) oxidizing the vertical cavity surface emitting laser from the trench sidewall to form a confinement oxide layer in the active layer. The dark region sub-pixel is formed by cutting a current path of the vertical cavity surface emitting laser of the corresponding region.

In some embodiments, the step 2) comprises: forming a patterned implant barrier layer in the lower mirror and the active layer or the upper mirror and the active layer, the implant barrier layer implanting passivation ions. Forming an ion passivation layer in the lower mirror and the active layer or the upper mirror and the active layer, the ion passivation layer for cutting the vertical cavity surface of the corresponding region. The current path of the laser is emitted to form dark-area sub-pixels.

In some embodiments, step 2) comprises: 2-1) depositing a metal layer on the upper mirror; 2-2) etching a pattern in the metal layer by a photolithography process and an etching process. The metal layer serves as a metal masking layer for masking the light exit path of the vertical cavity surface emitting laser of the corresponding region to form a dark region sub-pixel.

In some embodiments, the step 2) comprises: etching the upper mirror by a photolithography process and an etching process to form a patterned high threshold reflection layer in the upper mirror, wherein the high threshold reflection layer is used to improve the intensity of the current required to exit the light of the vertical cavity surface emitting laser is such that the vertical cavity surface emitting laser of the corresponding region of the high threshold reflective layer does not have light exiting to form a dark region sub-pixel.

As described above, the pixel structure of the vertical cavity surface emitting laser of the present invention and the manufacturing method thereof may have the following beneficial effects and characteristics:

1) Aspects of the present invention form a plurality of bright-area sub-pixels with light exiting and a plurality of dark-area sub-pixels having no light exiting in the emission window of the vertical cavity surface emitting laser, forming a pattern directly in the emission window. It passes current only in the area of the bright-area sub-pixels, and no current flows in the area of the dark-area sub-pixels, which can greatly improve the energy efficiency of the device and reduce the energy consumption of the device.

2) Aspects of the invention can form a pattern in the emission window of a vertical cavity surface emitting laser, such as a digital pattern, a letter pattern and a text pattern, a matrix pattern, a two-dimensional code pattern, etc., which greatly improves the portability of the vertical cavity surface emitting laser. Information extends its range of applications.

3) Aspects of the present invention are compatible with the fabrication process of the existing vertical cavity surface emitting laser, and does not require an additional external mask when displaying an image, which is advantageous for the reduction of manufacturing cost.

4) Each pixel structure in the pixel array of the present invention can be independently identified without depending on the adjacent pixel structure, greatly enhancing the resolvability of the pixel array.

5) Aspects of the present invention can form a pixel array of a plurality of vertical cavity surface emitting lasers, wherein the pixel array includes not only position information of the pixel structure but also pattern information of the pixel structure, compared to the existing structural optical mode. The group scheme and the coded structure optical module scheme can effectively reduce the energy consumption and manufacturing cost of the structural optical and the encoded optical unit optical module while maintaining a certain information density, or can be achieved under the same cost and energy consumption but with higher information density and recognizability.

Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

FIGS. 8a-8c are schematic views showing an implementation of a pixel structure, wherein FIG. 8b is a schematic cross-sectional view of A-A' in FIG. 8a, the pixel structure is defined by a trench and a limiting oxide layer.

FIGS. 9a to 9c are schematic views showing another implementation of the pixel structure, wherein FIG. 9b is a schematic cross-sectional view of the pixel structure of FIG. 9a, which is formed by an ion passivation layer.

DETAILED DESCRIPTION OF THE PREFERRED EMBODIMENTS

Figure 1A:
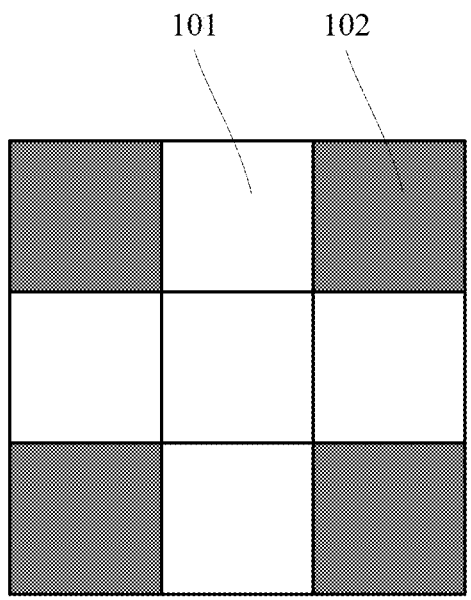
FIGS. 1a-1i show a schematic diagram of a pixel structure of a vertical cavity surface emitting laser, in which bright-area sub-pixels and dark-area sub-pixels are arranged in a 3*3 matrix in the emission window.
Figure 1B:
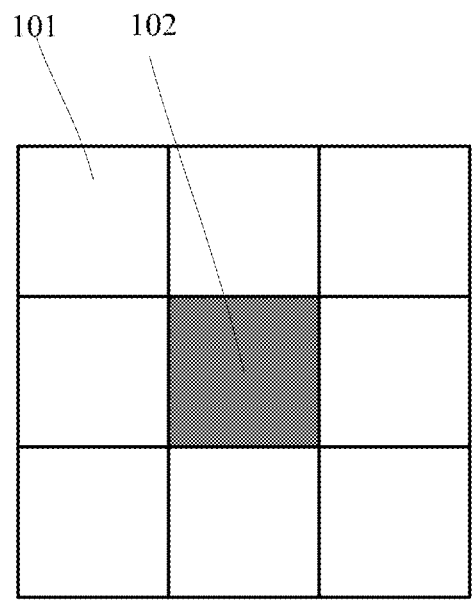
Figure 1C:
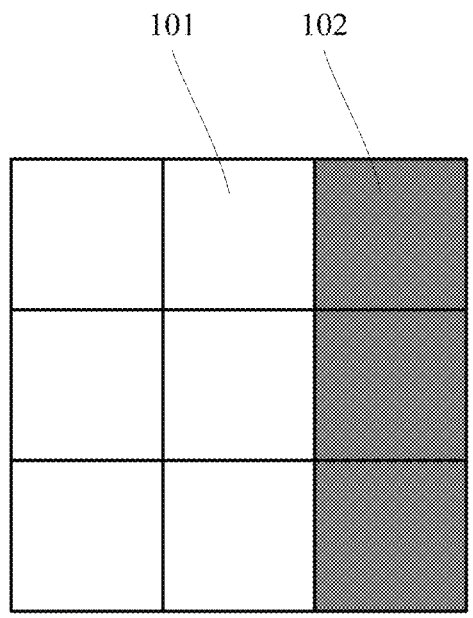
Figure 1D:
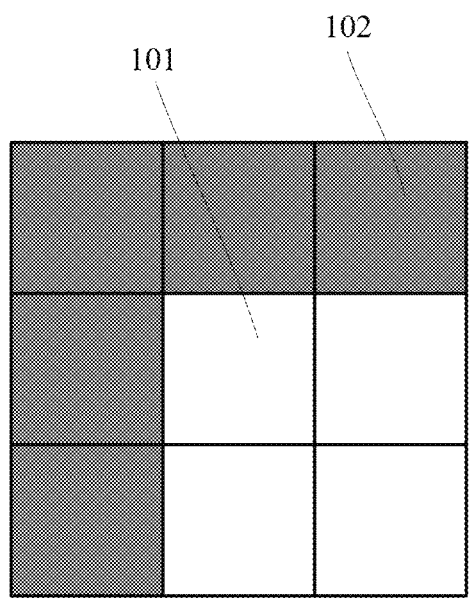
Figure 1E:
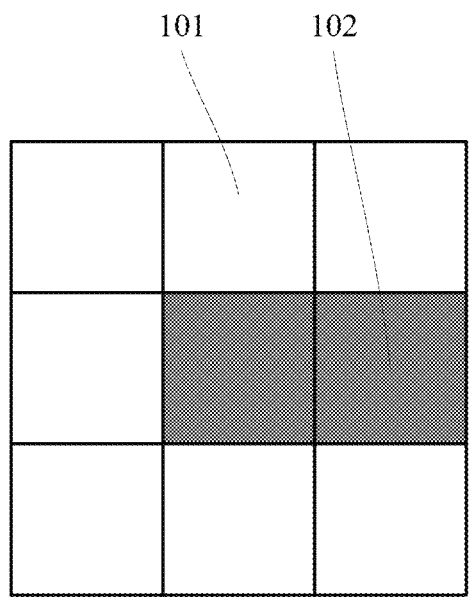
Figure 1F:
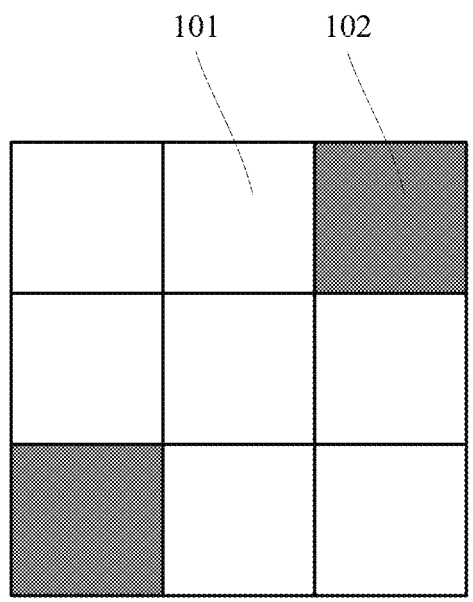
Figure 1G:
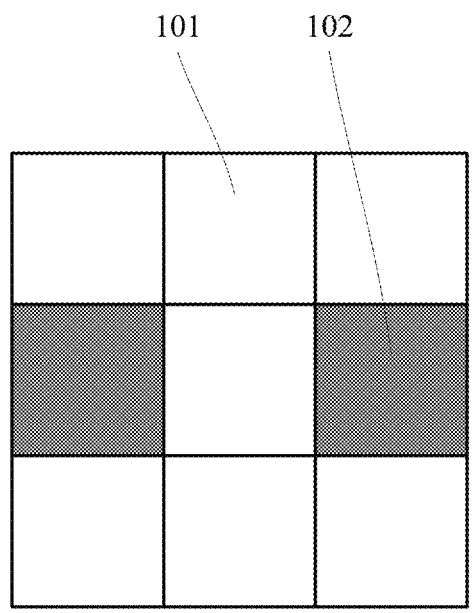
Figure 1H:
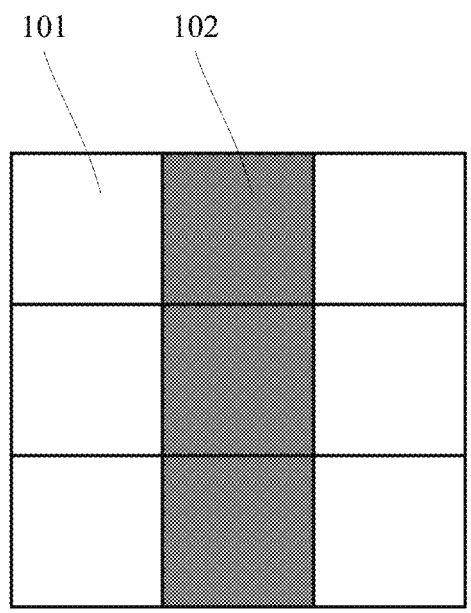
Figure 1I:
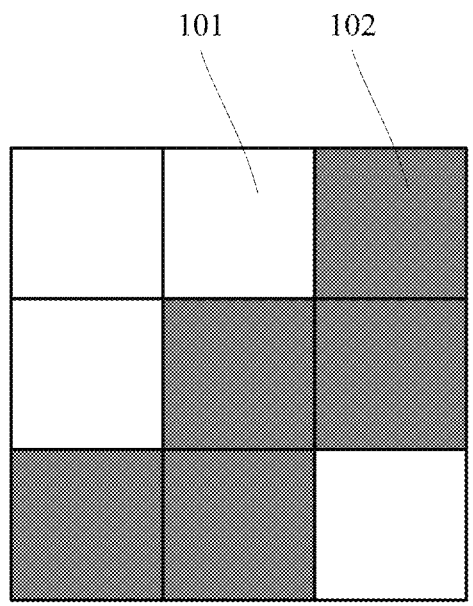
Figure 2A:
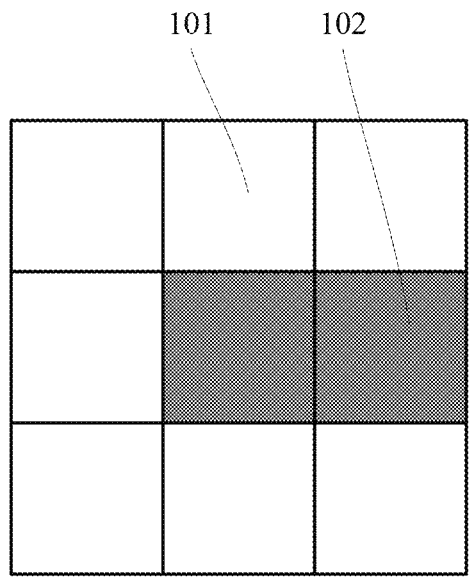
FIGS. 2a-3c are schematic diagrams showing an approximate pattern of bright-area sub-pixels and dark-area sub-pixels arranged in the emission window in the pixel structure of the vertical cavity surface emitting laser.
Figure 2B:
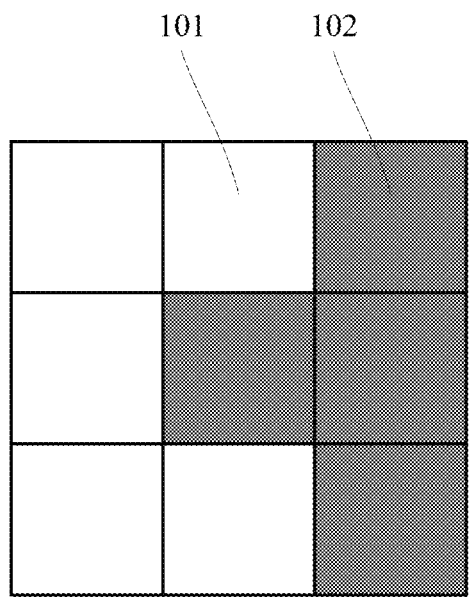
Figure 2C:
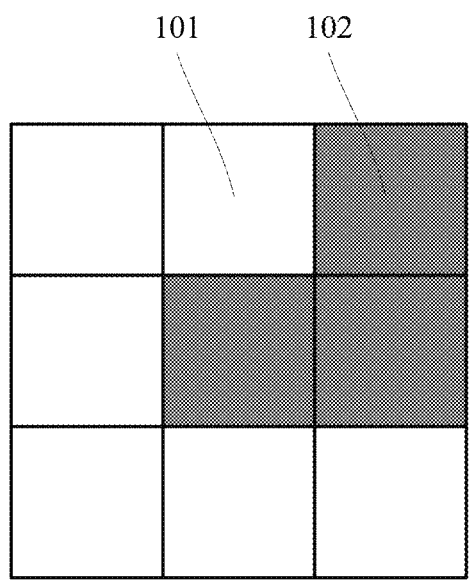

The embodiments of the present invention are described below by way of specific examples, and those skilled in the art can readily understand other advantages and effects of the present invention from the disclosure of the present disclosure. The present invention may be embodied or applied in various other specific embodiments, and various modifications and changes can be made without departing from the spirit and scope of the invention.

It should be noted that the illustrations provided in the embodiments merely illustrate the basic concept of the present invention in a schematic manner, and only the components related to the present invention are shown in the drawings, rather than the number and shape of components in actual implementation. Dimensional drawing, the actual type of implementation of each component's type, number and proportion can be a random change, and its component layout can be more complicated.

As shown in FIG. 1a to FIG. 11, embodiments provide a pixel structure of a vertical cavity surface emitting laser. The vertical cavity surface emitting laser has an emission window 103, and the pixel structure is formed in the emission window 103. The pixel structure has a plurality of bright-area sub-pixels 101 having light emission and a plurality of dark-area sub-pixels 102 having no light emission, and the bright-area sub-pixels 101 and the dark-area sub-pixels 102 are arranged in the emission window 103 in a digital pattern for the vertical cavity surface emitting laser. The outer peripheral side of the emission window 103 is provided with a ring-shaped upper electrode surrounding the emission window 103, and the ring-shaped upper electrode is a common electrode of the bright-area sub-pixel and the dark-area sub-pixel of the pixel structure.

For example, as shown in FIG. 1a to FIG. 1i, the bright-area sub-pixel 101 and the dark-area sub-pixel 102 may be arranged in a matrix pattern in the emission window 103. The bright-area sub-pixel 101 and the dark-area sub-pixel 102 are the same size, and the shapes are substantially square. The bright-area sub-pixels 101 and the dark-area sub-pixels 102 can be arranged in m×n array. The matrix pattern, in theory, can produce $2^{(m*n)}$ different patterns. For the sake of simplicity, taking n=m=3 as an example, the bright-area sub-pixels 101 and the dark-area sub-pixels 102 can be arranged in 512 different patterns, and FIG. 1a to FIG. 1i only show 3*3=9 different pattern examples of the matrix pattern, by which the bright region sub-pixel 101 and the dark region sub-pixel 102 are arranged differently. More patterns can be realized. The number and arrangement of the pixels 101,102 can be adjusted according to actual needs. For example, the bright-area sub-pixels 101 and the dark-area sub-pixels 102 can be arranged in a 4*4 matrix pattern, a 4*5 matrix pattern, etc. The matrix pattern is not limited to the examples listed herein.

Figure 3A:
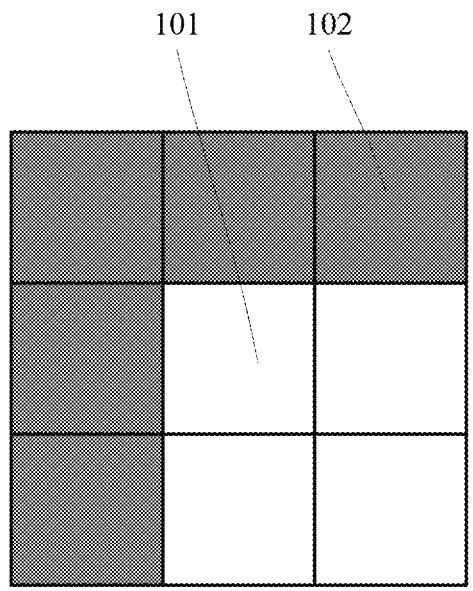
Figure 3B:
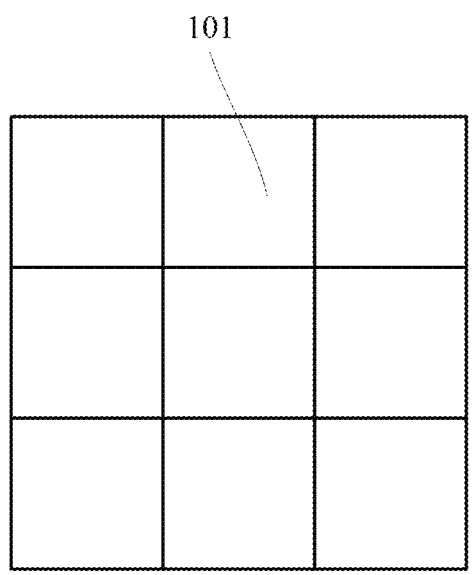
Figure 3C:
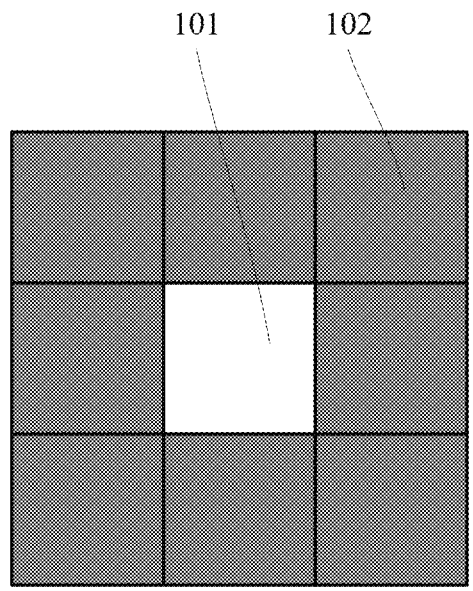

When the pixel structure is recognized, the bright region sub-pixels 101 are preferably used as the recognition target to improve the recognition degree of the pattern. Further, to avoid the error of the similar pattern in the recognition process, the appearance of the approximate pattern can be avoided at the time of design. For example, when the pixel structure is designed as the pattern shown in FIG. 2a, it should be avoided to use the patterns shown in FIG. 2b and FIG. 2c. As another example, when the pixel structure is designed as a pattern as shown in FIG. 3a, the use of the patterns of FIGS. 3b and 3c should be avoided to enhance the identifiability of the pixel structure.

Figure 4A:
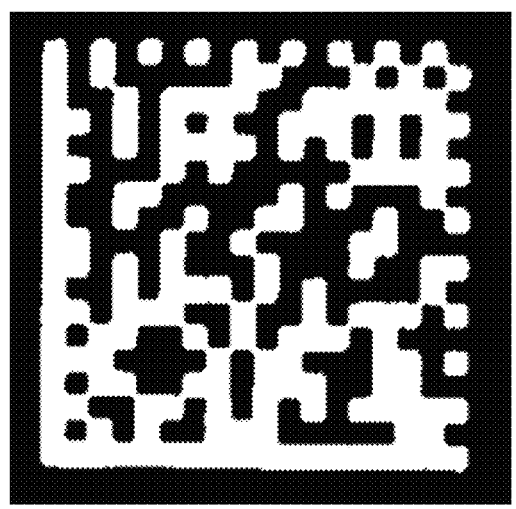
FIGS. 4a-4b are respectively a schematic diagram showing bright-area sub-pixels and dark-area sub-pixels arranged in a two-dimensional matrix in the emission window and arranged in a two-dimensional code pattern.
Figure 4B:

The above-mentioned bright-area sub-pixels 101 and the dark-area sub-pixels 102 can be arranged in a two-dimensional matrix in the emission window 103 by adding more numbers of sub-pixels and adopting different arrangements, as shown in FIG. 4a. It can also be arranged in a two-dimensional code pattern, as shown in FIG. 4b.

Figure 5:
FIG. 5 is a schematic view showing the strip-shaped bright-area sub-pixels arranged in a letter pattern.

As another example, as shown in FIG. 5, the pattern includes a plurality of strip-shaped bright-area sub-pixels separated by the dark-area sub-pixels. The bright-area sub-pixels and the dark-area sub-pixels may be arranged in the emission window into one of a digital pattern, a text pattern, and a letter pattern.

Figure 6A:
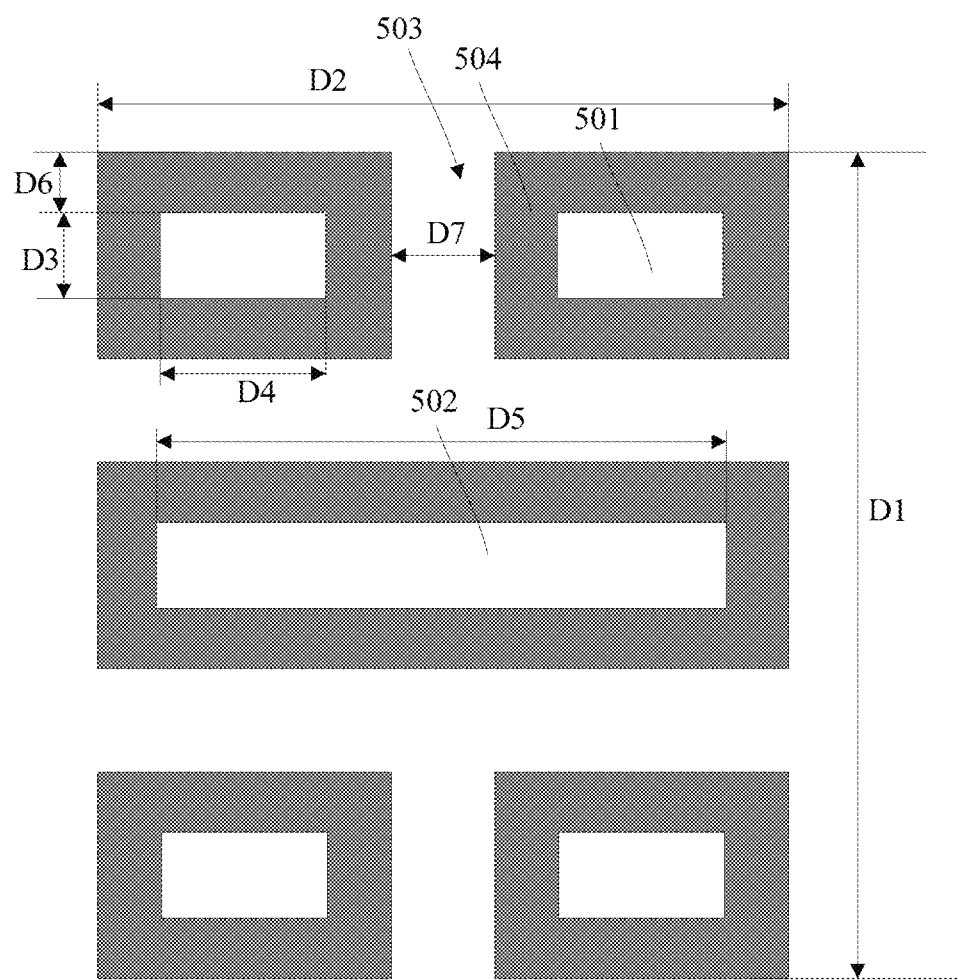
FIGS. 6a-6b are schematic diagrams showing the size comparison of the pixel structures of the vertical cavity surface emitting lasers of the front side emitting structure and the back side emitting structure, respectively.
Figure 6B:
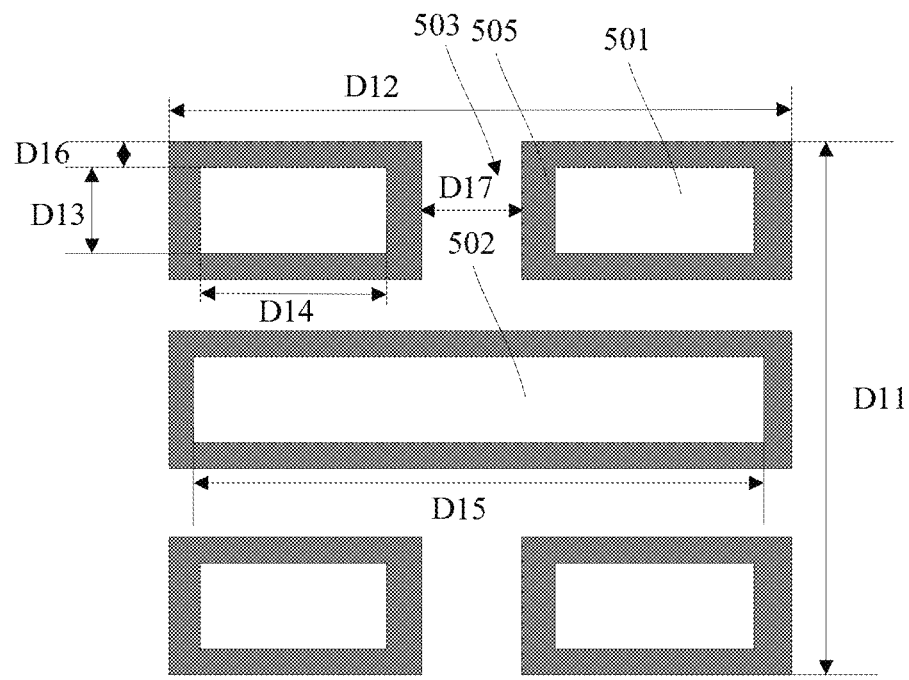

For another example, as shown in FIG. 6a and FIG. 6b, the pattern may include a plurality of first strip-shaped bright-area sub-pixels 501 and a plurality of second strip-shaped bright-area sub-pixels 502. The strip-shaped bright-area sub-pixels 501, 502 are separated by the dark-area sub-pixels. The length of the second strip of bright-area sub-pixels 502 is greater than the length of the first strip of bright-area sub-pixels 501.

As shown in the embodiment of FIG. 6, the pattern includes a Pa Kua array formed by a second strip of bright-area sub-pixels 502, and two sets of first strips of bright-area sub-pixels 501 respectively located on opposite sides of the second strip of bright-area sub-pixels 502. The sub-pixel includes two spaced-apart first strip-shaped bright-area sub-pixels 501, which appear as artifacts in the Book of Changes.

FIG. 6a is a schematic structural view showing a pixel structure of a vertical cavity surface emitting laser having a front emission structure, the pixel structure having a length D1 of about 40 micrometers to 50 micrometers and a width D2 of about 40 micrometers to 50 micrometers. The length D4 of the bright-area sub-pixel 501 is between 3 micrometers and 10 micrometers, the width D3 is between 3 micrometers and 10 micrometers, and the length D5 of the second bright-field sub-pixel 502 is between 10 micrometers and 30 micrometers with the same width between 3 micrometers and 10 micrometers. The width D6 of the oxide layer 504 is between 4 micrometers and 10 micrometers, and the width D7 of the trench 503 is between 1 micrometer and 10 micrometers. The pixel structure of the vertical cavity surface emitting laser of the front emission structure uses a metal ring electrode to be electrically contacted on the front side, and the metal ring electrode cannot block the laser light in the emission window 103. In design, the length of the oxide layer 504 is usually required. Designed to be larger than the width of the metal ring electrode, the length of the oxide layer 504 generally is no less than 4 micrometers. Therefore, the size of the pixel structure of the front-emitting vertical cavity surface emitting laser is limited by the oxide layer 504. If the size of the pixel structure is large, the density is small.

Figure 7:
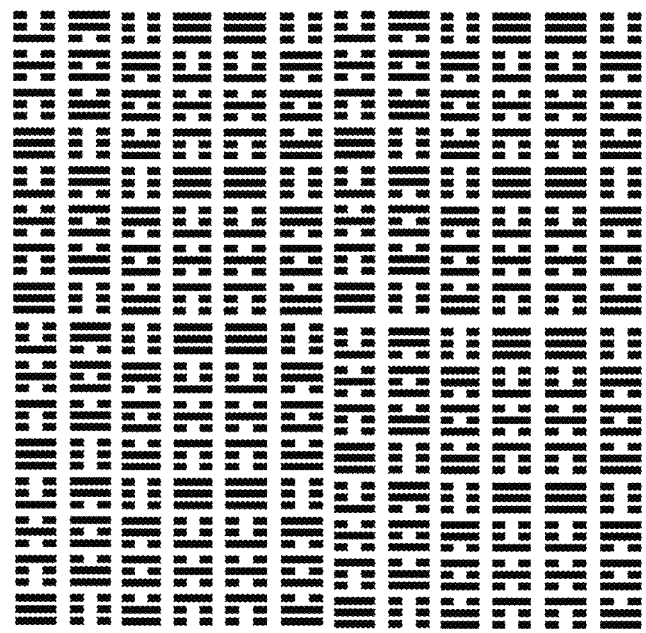
FIG. 7 is a schematic illustration of an array pattern of strip-shaped bright-area sub-pixels.

FIG. 6b is a schematic view showing the structure of a pixel structure of a vertical cavity surface emitting laser having a back-emitting structure having a length D11 of about 20 μm and a width D12 of about 20 μm. For the first strip-shaped bright-area sub-pixel 501, the length D14 is between 3 micrometers and 10 micrometers, the width D13 is between 3 micrometers and 10 micrometers, and the length of the second bright-field sub-pixel 502 is between 10 micrometers and 30 micrometers and the width is between 3 micrometers and 10 micrometers. The oxide layer 504 has a length D16 of between 0.5 micrometers and 4 micrometers, and the trench 503 has a width D17 of between 1 micrometer and 10 micrometers. One advantage of the pixel structure of the vertical cavity surface emitting laser of the back emitting structure is that only the metal ring electrode needs to be fabricated in a region other than the emission window 103, and therefore, the width of the oxide layer 505 can be designed to be less than 1 micrometer. Therefore, the pixel structure can be designed to have a width of less than 20 micrometers or less. Compared with the pixel structure of the vertical cavity surface emitting laser of the front emitting structure, the size of the pixel structure can be reduced, and the density of the pixel structure can be increased, thereby obtaining a higher image information density. Further, a plurality of the first strip-shaped bright-area sub-pixels 501 and a plurality of the second strip-shaped bright-area sub-pixels 502 are designed and arranged to form an array pattern as shown in FIG. 7. The pixel structure of the above structure has a simple manufacturing process, a simple pattern and is easy to be recognized, and has a wide application prospect.

Figure 8A:
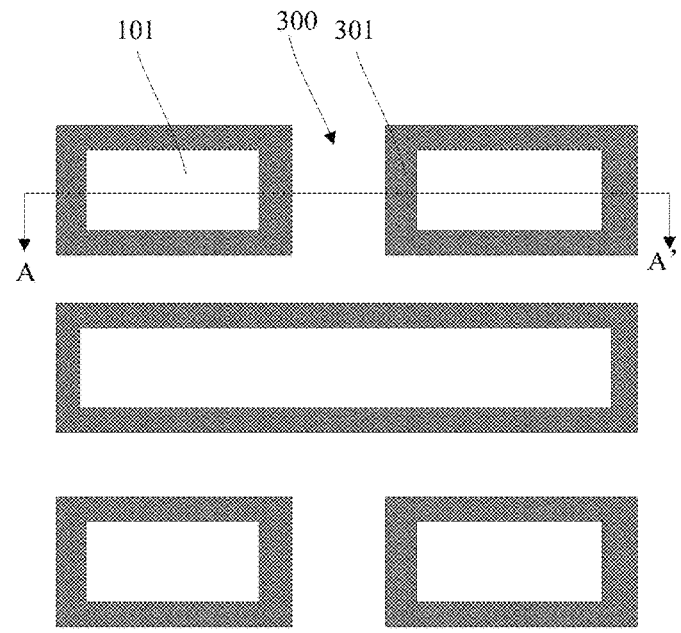
Figure 8B:
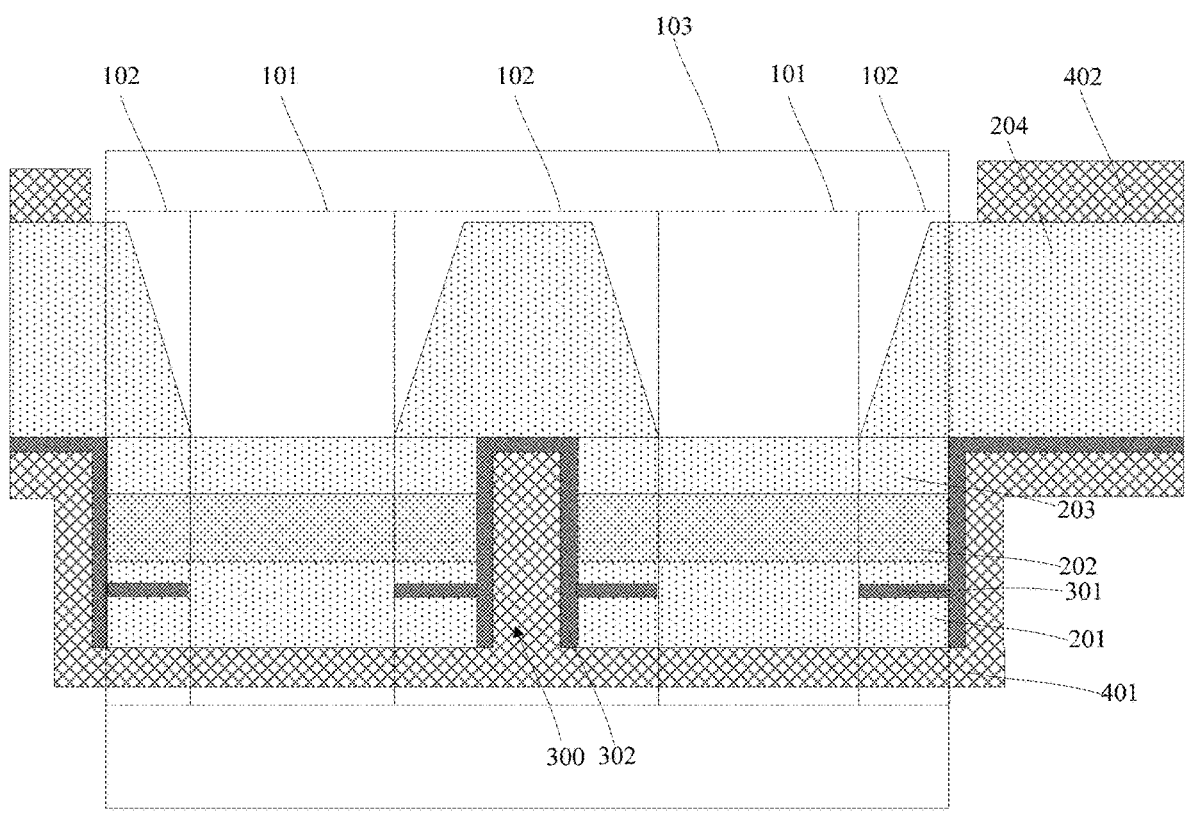

One implementation is shown in FIGS. 8a and 8b, wherein FIG. 8b is shown as a cross-sectional structural view at A-A' in FIG. 8a. As shown in FIG. 8b, the dark region sub-pixel 102 is implemented in the vertical cavity surface emitting laser with a patterned trench 300 and a sidewall from the trench 300 toward the vertical cavity surface. The manner of extending the oxide layer is defined, and the trench 300 and the limiting oxide layer 301 are used to cut the current path of the vertical cavity surface emitting laser of the corresponding region to form the dark region sub-pixel 102.

Specifically, the vertical cavity surface emitting laser may be a vertical cavity surface emitting laser of a back emitting structure, including a lower mirror 201, an active layer 202, an upper mirror 203, a trench 300, and a trench sidewall insulating layer 302, a limiting oxide layer 301, a substrate 204, a lower electrode 401, and an upper electrode 402. The lower mirror 201 is a P-type conductive mirror, and the upper mirror surface is covered with a protective layer 404, and the upper mirror 203 As an N-type conductive mirror, the upper mirror and the lower mirror may be a Bragg mirror DBR (distributed Bragg reflector).

The active layer 202 is located on the lower mirror 201 for converting electrical energy into light energy. The upper mirror 203 is located on the active layer 202, and the lower mirror 201 and the upper mirror 203 are used for reflection enhancement of the light generated by the active layer 202, and a laser is formed. The surface of the upper mirror 203 emits light. The trench 300 is formed by pattern removing the lower mirror 201, the active layer 202 and the upper mirror 203. The trench sidewall insulating layer 302 is formed on the sidewall of the trench. The sidewall insulating layer is formed in a manner of oxidizing from the sidewall of the trench 300 toward the inside of the vertical cavity surface emitting laser. For example, the limiting oxide layer 301 may be formed in the vertical cavity-emitting laser in a P-conducting mirror. The trench 300 and the confinement oxide layer 301 are used to cut off the current path of the vertical cavity surface emitting laser of the corresponding region, and are jointly defined to form the dark region sub-pixel 102. The minimum width of the sub-pixel 102 typically is 6 microns. The substrate 204 is located on the upper reflective layer, and the substrate 204 is etched away corresponding to the laser emitting region to form a cavity to enhance the emission intensity of the laser. The lower electrode 401 is formed on the bottom surface of the lower mirror 201 to realize electrical extraction of the lower mirror 201. The upper electrode 402 is designed as a metal ring electrode on the upper surface of the substrate 204 and an entire upper emission window 103 is surrounded. That is, an annular upper electrode is disposed correspondingly on the outer peripheral side of each of the emission windows 103 to realize electrical extraction of the upper mirror 203.

Figure 8C:
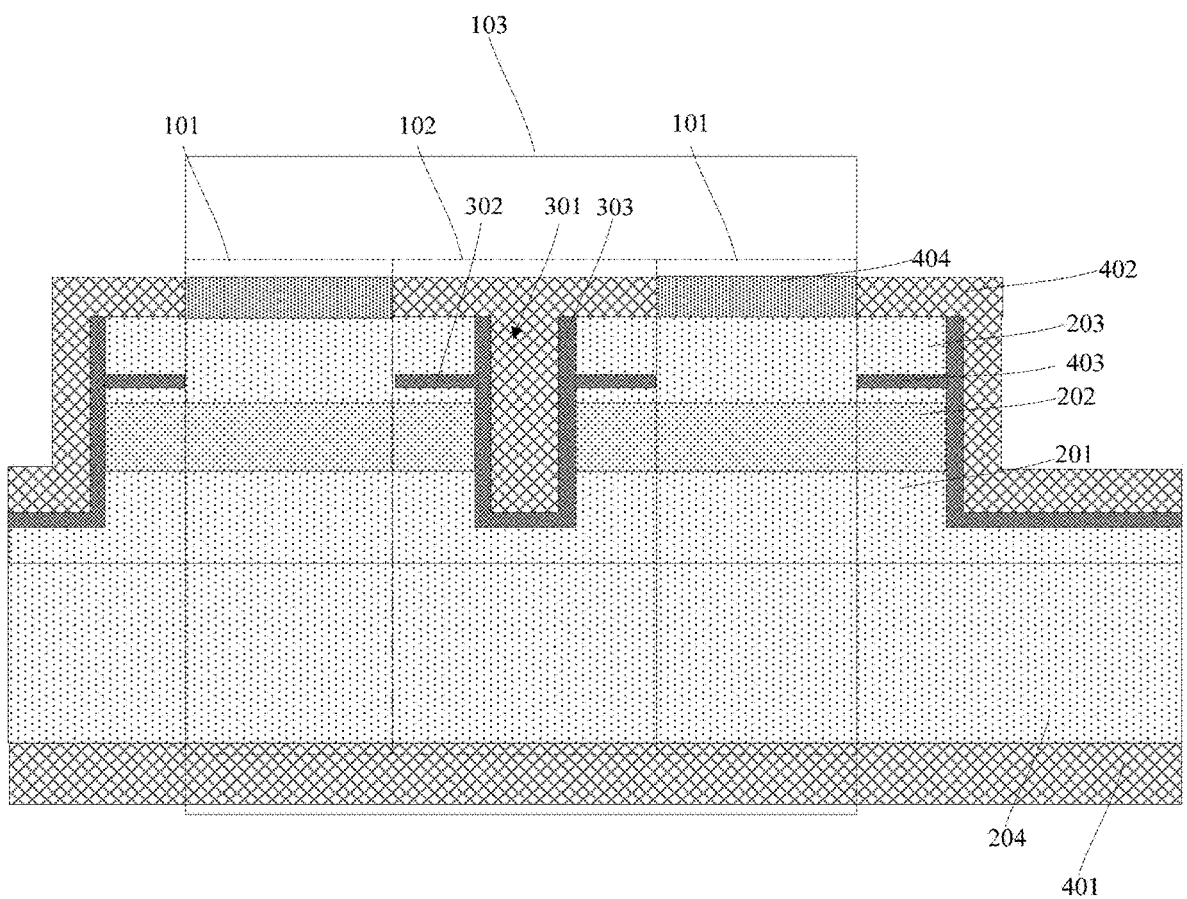

The vertical cavity surface emitting laser can also be a vertical cavity surface emitting laser with a front emitting structure, and its structure is as shown in FIG. 8c. Its basic structure is a flip structure of a back surface reflecting vertical cavity surface emitting laser. The vertical cavity surface emitting laser of the emission structure is different in that the lower mirror 201 is an N-type conductive mirror, and the upper mirror 203 is a P-type conductive mirror, and the upper mirror surface is covered. There is a protective layer 404. The lower electrode 401 covers the back side of the entire substrate, and the upper electrode 402 surrounds the emission window 103.

Figure 9A:
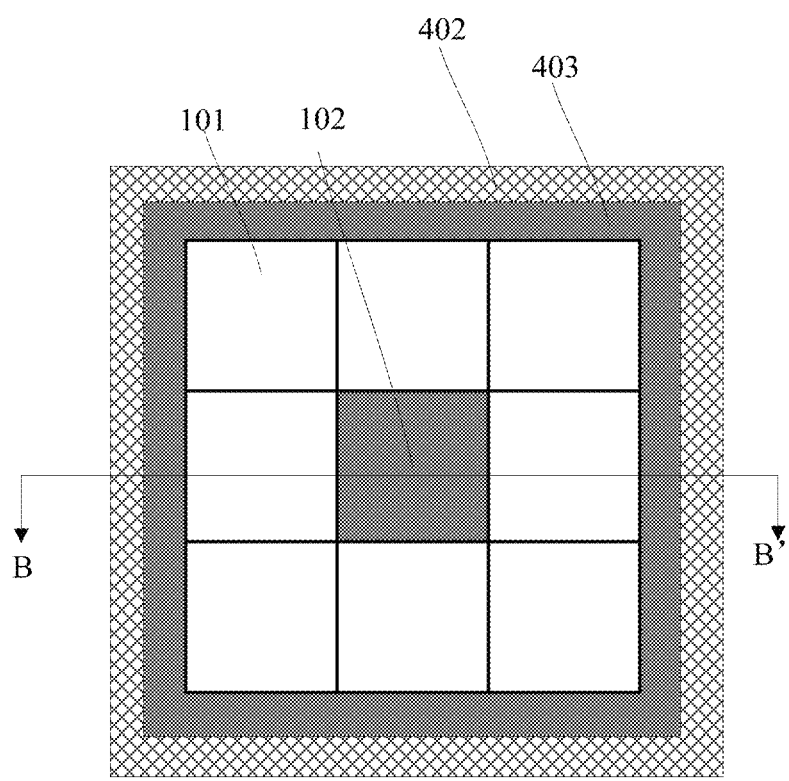
Figure 9B:
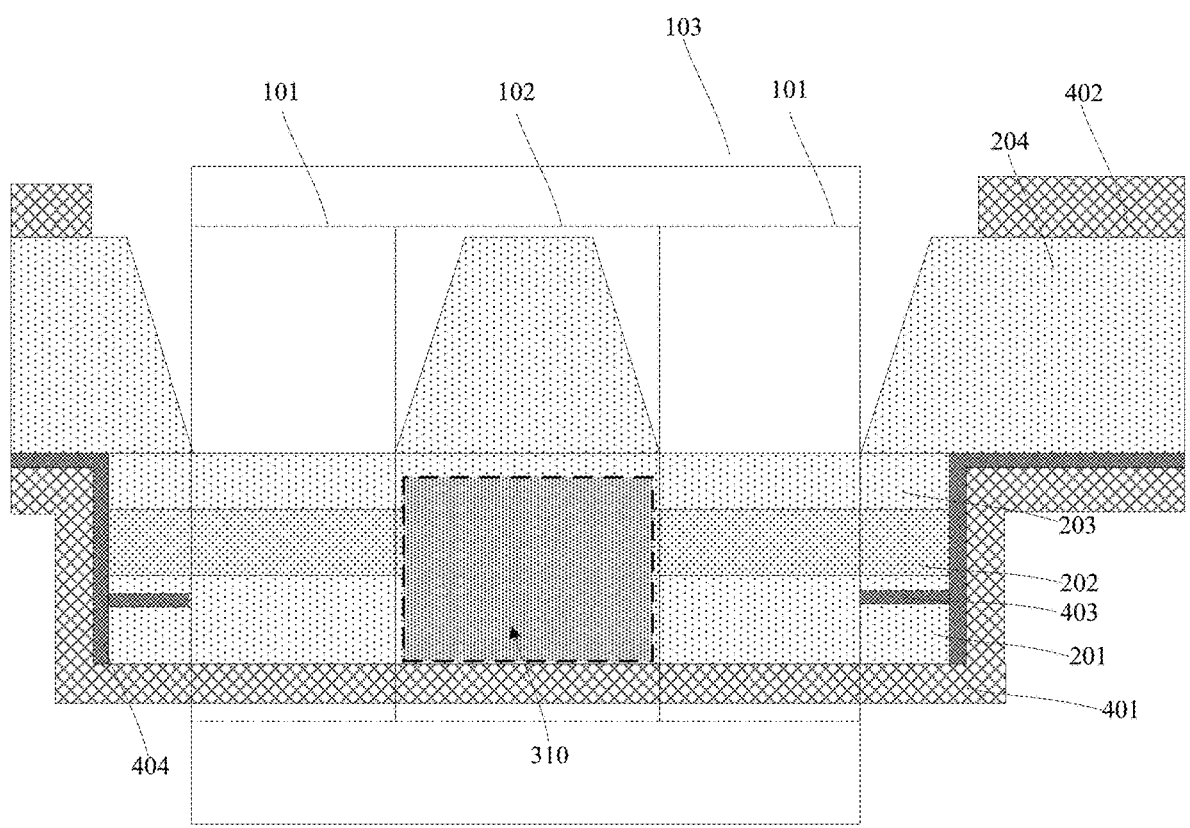

Another implementation is shown in FIG. 9a to FIG. 9b, wherein FIG. 9b is a cross-sectional structural view at BB' in FIG. 9a. The ion passivation layer 310 can also be defined in the manner of a patterned ion passivation layer 310 for cutting the current path of the vertical cavity surface emitting laser of the corresponding region to form the dark region sub-pixel 102.

Specifically, the vertical cavity surface emitting laser may be a vertical cavity surface emitting laser of a back emitting structure, including a lower mirror 201, an active layer 202, an upper mirror 203, a sidewall insulating layer 404, a limiting oxide layer 403, the substrate 204, the lower electrode 401 and the upper electrode 402, and the ion passivation layer 310. The lower mirror 201 is a P-type conductive mirror, and the upper mirror surface is covered with a protective layer 404, and the upper mirror 203 is an N-type conductive mirror. The active layer 202 is located on the lower mirror 201 for converting electrical energy into light energy. The upper mirror 203 is located on the active layer 202, and the lower mirror 201 and the upper mirror 203 are used for reflection enhancement of the light generated by the active layer 202, and a laser is formed. The surface of the upper mirror 203 emits light. The ion passivation layer 310 is formed in the lower mirror 201 and the active layer 202 or the upper mirror 203 and the active layer 202 by passivation ion implantation. The layer 310 is used to cut the current path of the vertical cavity surface emitting laser of the corresponding region to form the dark region sub-pixel 102, and the dark region sub-pixel 102 defined in this way typically has a minimum width of 5 micrometers. The ion passivation layer 310 has high insulation performance and can effectively cut off current, so that no light is generated there, and energy consumption can be saved. The substrate 204 is located on the upper reflective layer, and the substrate 204 is etched away corresponding to the laser emitting region to form a cavity to enhance the emission intensity of the laser. The lower electrode 401 is formed on the bottom surface of the lower mirror 201 to realize electrical extraction of the lower mirror 201. The upper electrode 402 is designed as a metal ring electrode on the upper surface of the substrate 204 and the entire emission window 103 is surrounded to achieve electrical extraction of the upper mirror 203.

The sidewall insulating layer of the present example is used to isolate the lower electrode 401 from the active layer 202 and the upper mirror 203, and the limiting oxide layer is used to define the emission window 103.

Figure 9C:
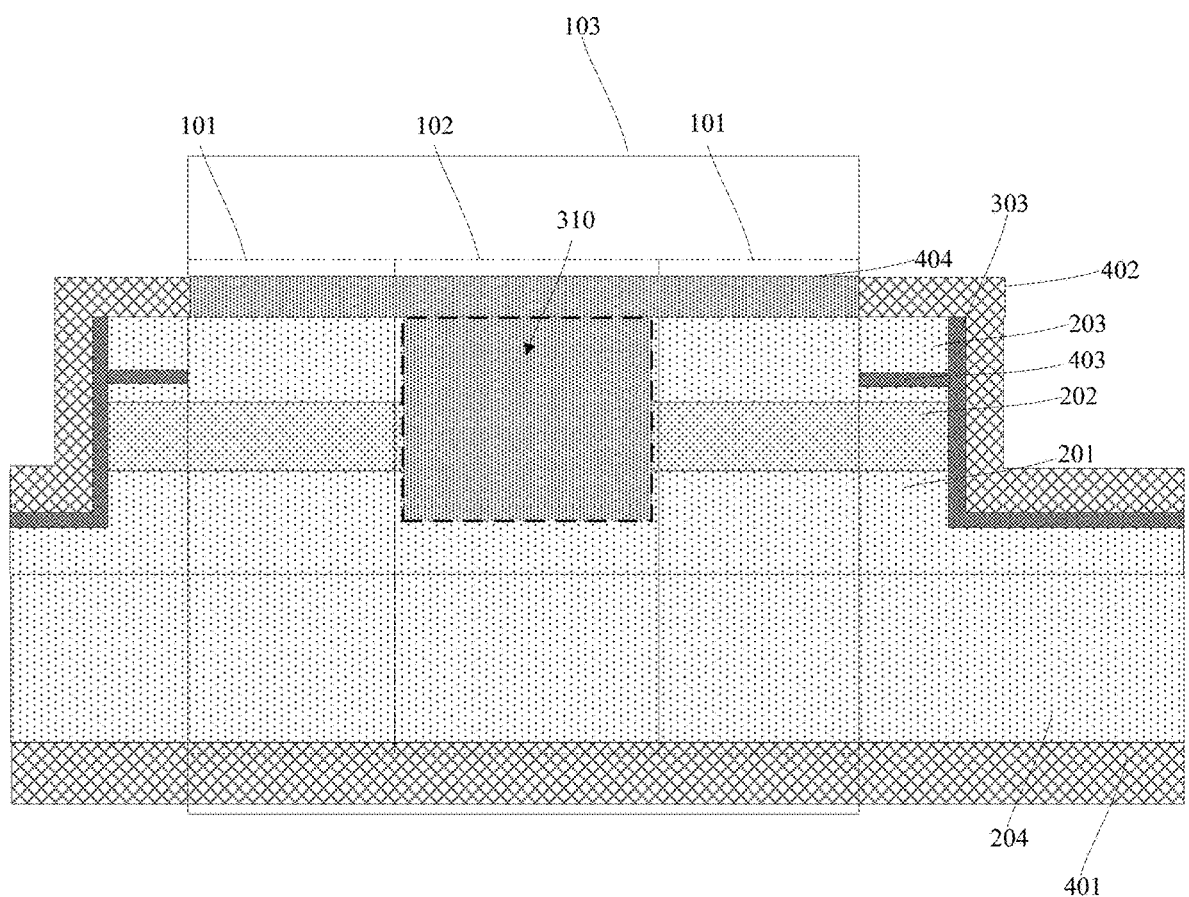

The vertical cavity surface emitting laser may also be a vertical cavity surface emitting laser with a front emitting structure, and its structure is as shown in FIG. 9c, and its basic structure is a flip structure of a back surface reflecting vertical cavity surface emitting laser. The vertical cavity surface emitting laser of the emission structure is different in that the lower mirror 201 is an N-type conductive mirror, and the upper mirror 203 is a P-type conductive mirror, and the upper mirror surface is covered. There is a protective layer 404. The lower electrode 401 covers the back side of the entire substrate, and the upper electrode 402 surrounds the emission window 103.

Figure 10A:
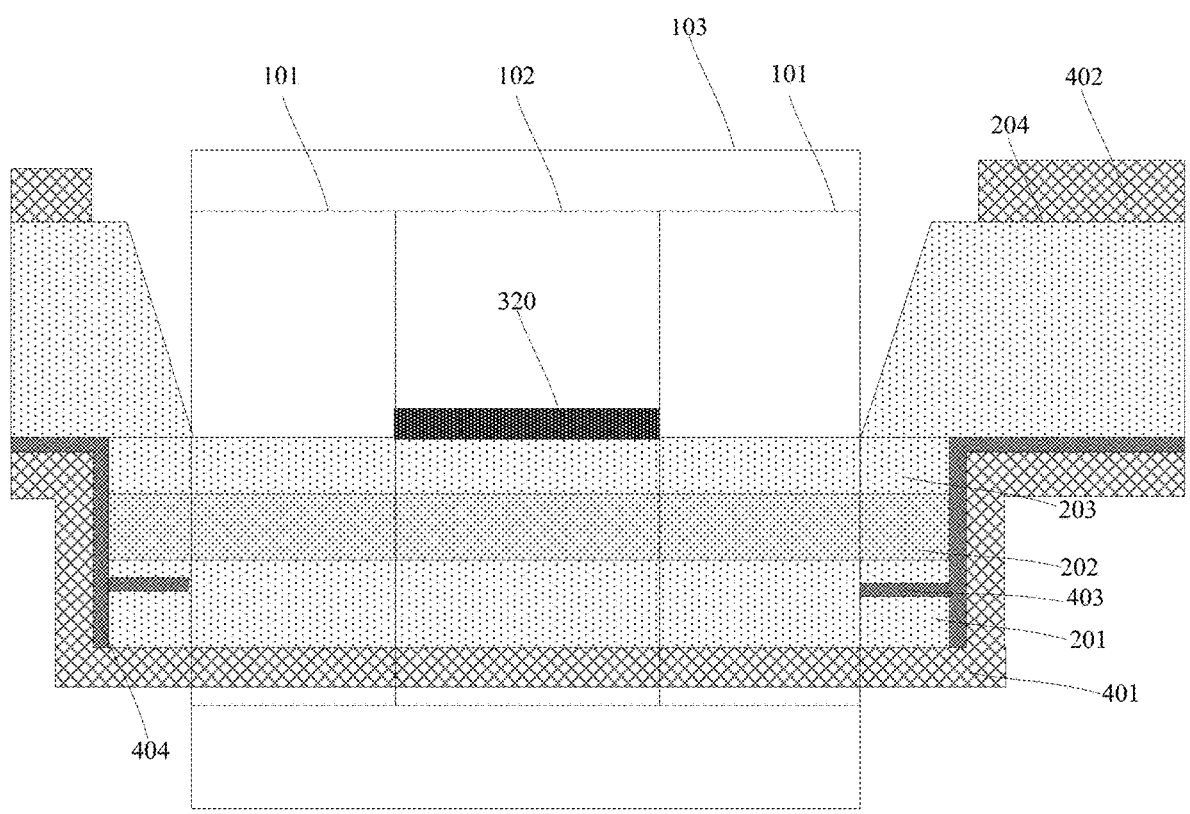
FIGS. 10a and 10b are schematic diagrams showing still another implementation of the pixel structure, which is implemented by a metal masking layer.

In yet another implementation, as shown in FIG. 10a, the dark region sub-pixel 102 is defined in the vertical cavity surface emitting laser in the form of a patterned metal masking layer 320. The vertical cavity surface of the corresponding region blocks a light exit path of the laser to form a dark region sub-pixel 102.

Specifically, the vertical cavity surface emitting laser includes a lower mirror 201, an active layer 202 on the lower mirror 201, an upper mirror 203 on the active layer 202, and a metal masking layer 320. The masking layer 320 is formed on the surface of the upper mirror 203 by metal deposition and pattern etching. Typically, the dark region sub-pixel 102 has a minimum width of 2 microns.

Specifically, the vertical cavity surface emitting laser may be a vertical cavity surface emitting laser of a back emitting structure, including a lower mirror 201, an active layer 202, an upper mirror 203, a sidewall insulating layer 404, a limiting oxide layer 403, a substrate 204, a lower electrode 401 and an upper electrode 402, and a metal masking layer 320. The lower mirror 201 is a P-type conductive mirror, and the upper mirror surface is covered with a protective layer 404, and the upper mirror 203 is N-type conductive mirror.

The active layer 202 is located on the lower mirror 201 for converting electrical energy into light energy. The upper mirror 203 is located on the active layer 202, and the lower mirror 201 and the upper mirror 203 are used for reflection enhancement of the light generated by the active layer 202, and a laser is formed. The surface of the upper mirror 203 emits light. The metal masking layer 320 is formed on the surface of the upper mirror 203 by metal deposition and pattern etching to mask the light exit path of the vertical cavity surface emitting laser of the corresponding region to form the dark region sub-pixel 102. The dark-area sub-pixel 102 defined in this manner typically has a minimum width of 2 microns. The substrate 204 is located on the upper reflective layer, and the substrate 204 is etched away corresponding to the laser emitting region to form a cavity to enhance the emission intensity of the laser. The lower electrode 401 is formed on the bottom surface of the lower mirror 201 to realize electrical extraction of the lower mirror. The upper electrode 402 is designed as a metal ring electrode on the upper surface of the substrate 204 and the entire emission window 103 is surrounded to achieve electrical extraction of the upper mirror 203.

The sidewall insulating layer 404 of the present example is used to isolate the lower electrode 401 from the active layer 202 and the upper mirror 203, and the limiting oxide layer 403 is used to define the emission window 103.

Since the metal masking layer 320 has a high reflectance, the light of the masked area cannot be emitted, and the masked area still generates heat, which reduces the total energy conversion efficiency of the pixel structure. However, the shape of the metal masking layer 320 can be as high as 0.1 micron. Although the energy efficiency is not very high, the metal masking layer 320 on the emission window 103 can realize a complicated structure such as a two-dimensional code and a data matrix.

Figure 10B:
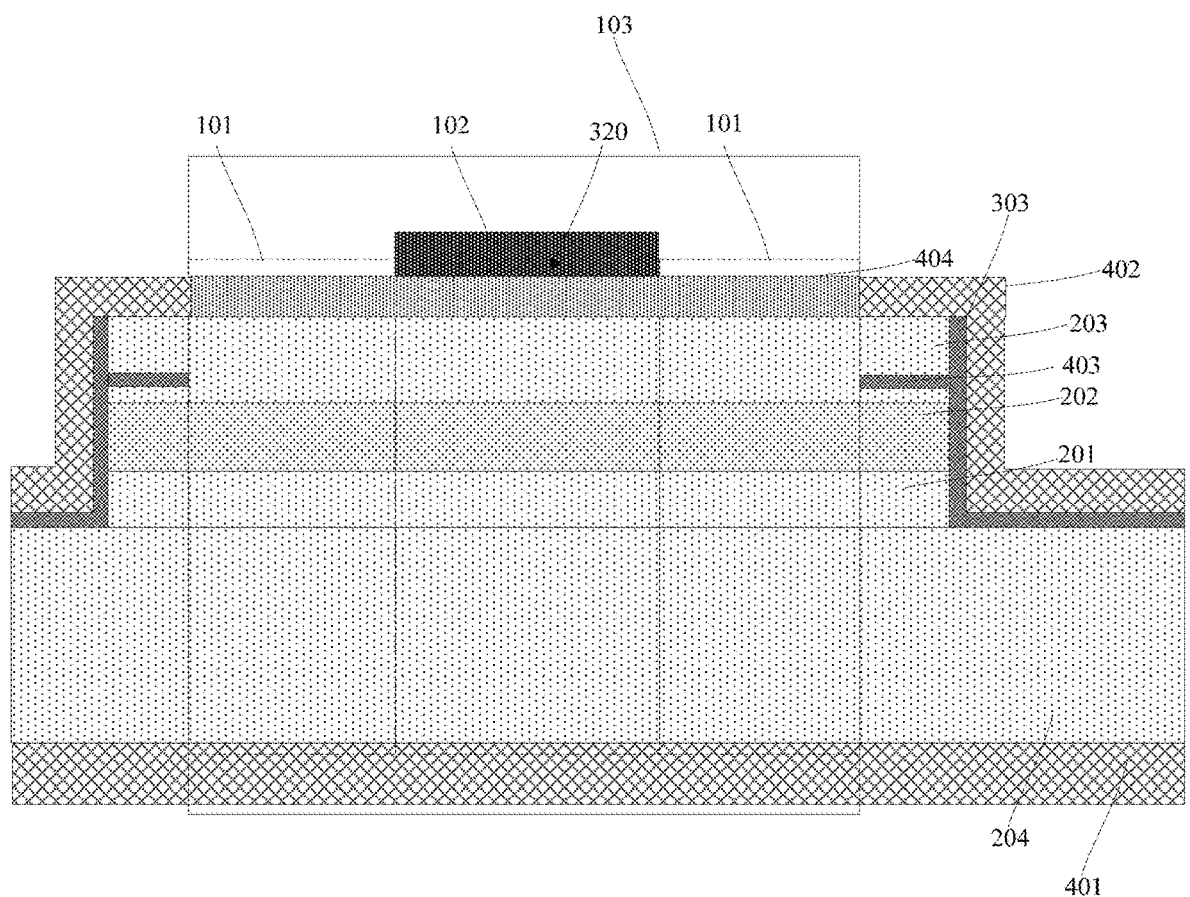

The vertical cavity surface emitting laser may also be a vertical cavity surface emitting laser with a front emitting structure, and its structure is as shown in FIG. 10b, and its basic structure is a flip structure of a back surface reflecting vertical cavity surface emitting laser. The vertical cavity surface emitting laser of the emission structure is different in that the lower mirror 201 is an N-type conductive mirror, and the upper mirror 203 is a P-type conductive mirror, and the upper mirror surface is covered. There is a protective layer 404. The lower electrode 401 covers the back side of the entire substrate, and the upper electrode 402 surrounds the emission window 103.

Figure 11A:
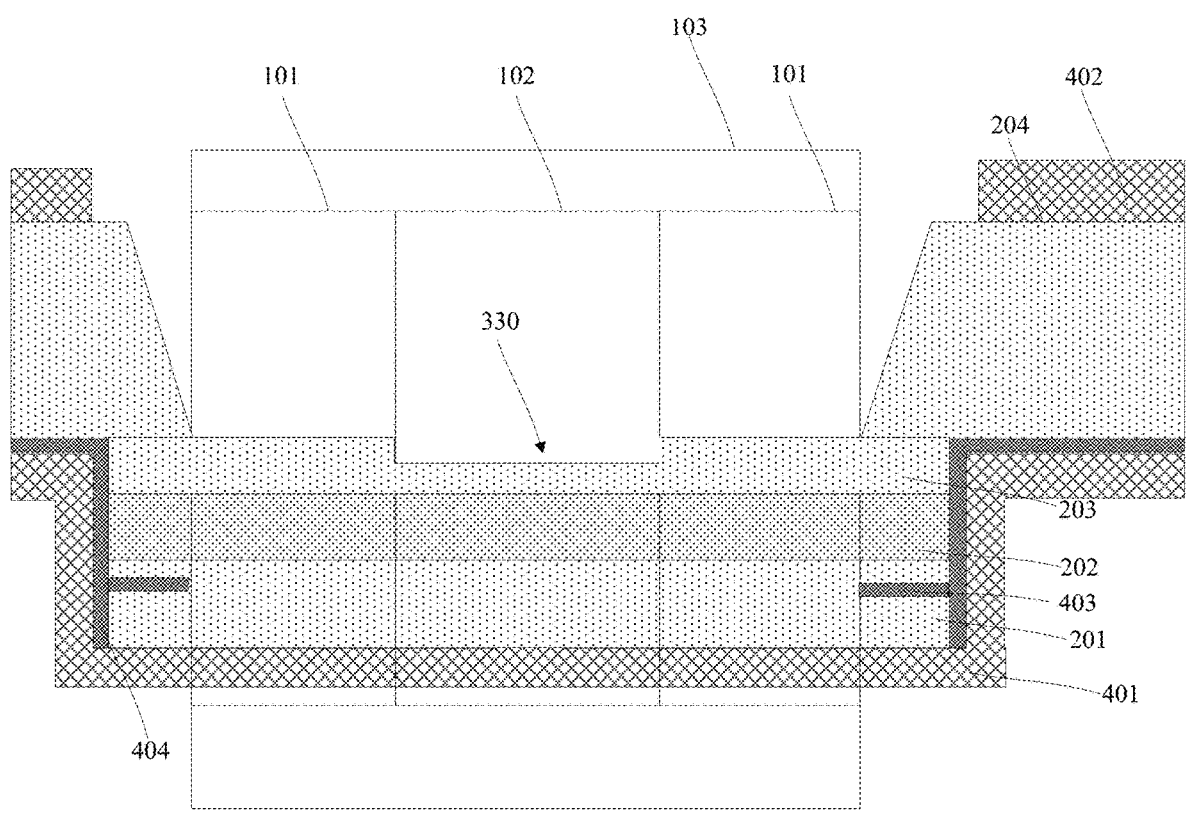
FIGS. 11a and 11b are diagrams showing still another implementation of the pixel structure, which is implemented by a high threshold reflective layer.

In still another implementation, as shown in FIG. 11a, the dark region sub-pixel 102 is defined in the vertical cavity surface emitting laser by a surface relief structure 330. A high threshold reflective layer 330 is used to increase the intensity of the current required for the light of the vertical cavity surface emitting laser to exit. The vertical cavity surface emitting laser of the corresponding region of the high threshold reflective layer 330 does not have light to exit, to form the dark region sub-pixel 102.

Specifically, the vertical cavity surface emitting laser may be a vertical cavity surface emitting laser of a back emitting structure, including a lower mirror 201, an active layer 202, an upper mirror 203, a sidewall insulating layer 404, a limiting oxide layer 403, a substrate 204, a lower electrode 401 and an upper electrode 402, and a surface relief structure 330. The lower mirror 201 is a P-type conductive mirror, and the upper mirror surface is covered with a protective layer 404. The mirror 203 is an N-type conductive mirror.

The active layer 202 is located on the lower mirror 201 for converting electrical energy into light energy. The upper mirror 203 is located on the active layer 202, and the lower mirror 201 and the upper mirror 203 are used for reflection enhancement of the light generated by the active layer 202. A laser is formed. The surface of the upper mirror 203 emits light.

The surface relief structure 330 is located in the lower mirror 201 or the upper mirror 203, and the high threshold reflective layer 330 is used to increase the current intensity required for the light of the vertical cavity surface emitting laser to exit. The vertical cavity surface emitting laser of the corresponding region of the high threshold reflective layer 330 thus forms the dark region sub-pixel 102, and the minimum width of the dark region sub-pixel 102 defined in this manner is typically 2 microns. The substrate 204 is located on the upper reflective layer, and the substrate 204 is etched away corresponding to the laser emitting region to form a cavity to enhance the emission intensity of the laser. The lower electrode 401 is formed on the bottom surface of the lower mirror 201 to realize electrical extraction of the lower mirror 201. The upper electrode 402 is designed as a metal ring electrode on the upper surface of the substrate 204 and the entire emission window 103 is surrounded to achieve electrical extraction of the upper mirror 203.

The sidewall insulating layer 404 of the present example is used to isolate the lower electrode 401 from the active layer 202 and the upper mirror 203, and the limiting oxide layer 403 is used to define the emission window 103.

Figure 11B:
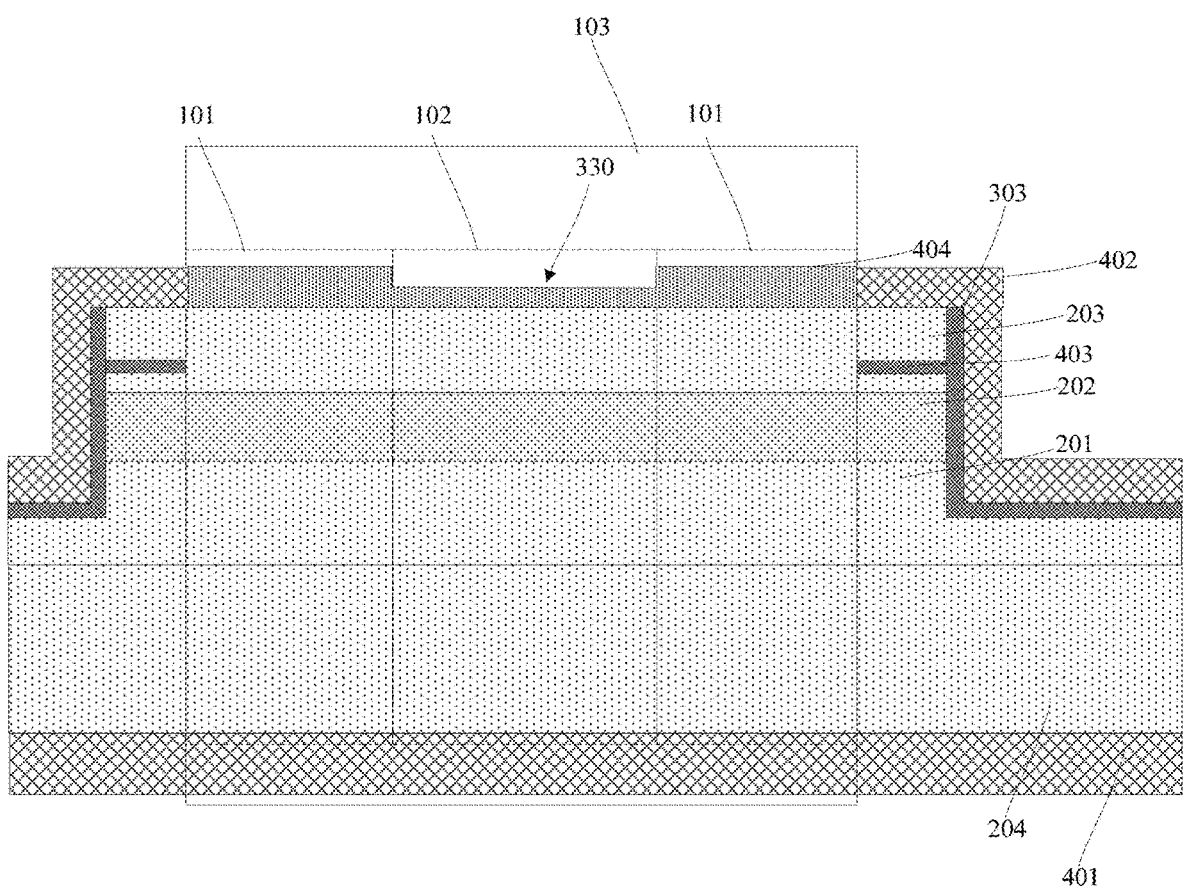

The vertical cavity surface emitting laser may also be a vertical cavity surface emitting laser with a front emitting structure, and its structure is as shown in FIG. 11b, and its basic structure is a flip structure of a back cavity reflecting vertical cavity surface emitting laser. The vertical cavity surface emitting laser of the emission structure is different in that the lower mirror 201 is an N-type conductive mirror, and the upper mirror 203 is a P-type conductive mirror, and the upper mirror surface is covered. The protective layer 404 is a dielectric layer whose thickness is changed from an integer multiple of a half wavelength to a half integer multiple. At this time, the dielectric layer changes from transparent to an anti-reflection film, and the effect is equivalent to reducing P-type conductivity. The reflectivity of the mirror thereby forms a high threshold reflective layer in this region. The lower electrode 401 covers the back side of the entire substrate, and the upper electrode 402 surrounds the emission window 103.

Characteristics of the different designs described above are summarized in Table 1.

TABLE 1

| | Typical sub-pixel minimum size (micrometers) | Typical information density (bit/mm2) | Typical Power conversion efficiency | Signal-to-noise ratio |
|---|---|---|---|---|
| Front-emitting structure with oxidation | 12 | $5 \times 10^3$ | 40% | high |
| Back-emitting structure with oxidation | 6 | $3 \times 10^4$ | 40% | high |
| Ion passivation | 5 | $4 \times 10^4$ | 25% | medium |
| Metal masking | 2 | $3 \times 10^5$ | 20% | high |
| Surface relief | 2 | $3 \times 10^5$ | 20% | low |

It should be noted that the parameters provided in Table 1 above are approximate values, which are obtained according to the average process level of the current vertical cavity surface emitting laser VCSEL industrial manufacturing, and have only relative reference meanings, and are not intended to limit the present invention.

Embodiments further provide a pixel array of a vertical cavity surface emitting laser, the pixel array comprising a plurality of pixel structures of vertical cavity surface emitting lasers arranged in an array to form a pattern array. The pattern array includes pattern information of a pixel structure of the vertical cavity surface emitting laser and position information of a pixel structure of the vertical cavity surface emitting laser. Each pixel structure in the pixel array may be independently identified without depending on the adjacent pixel structure, greatly enhancing the resolvability of the pixel array. The pixel structure of the plurality of vertical cavity surface emitting lasers can be formed into a pixel array, wherein the pixel array not only includes position information of the pixel structure but also pattern information of the pixel structure, and the pixel array has higher information density.

Figure 12:
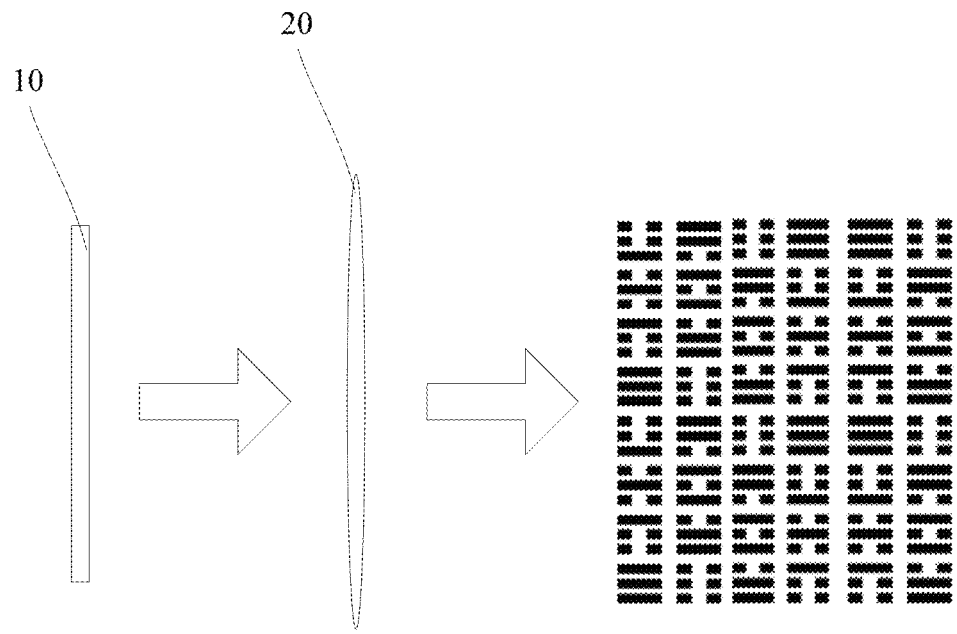
FIGS. 12 and 13 are schematic views showing the structure of the optical component, respectively.

As shown in FIG. 12, the embodiment further provides an optical component including the pixel structure 10 of the vertical cavity surface emitting laser and the optical lens 20 disposed on the pixel structure 10 to achieve amplification of the pattern and projection.

Figure 13:
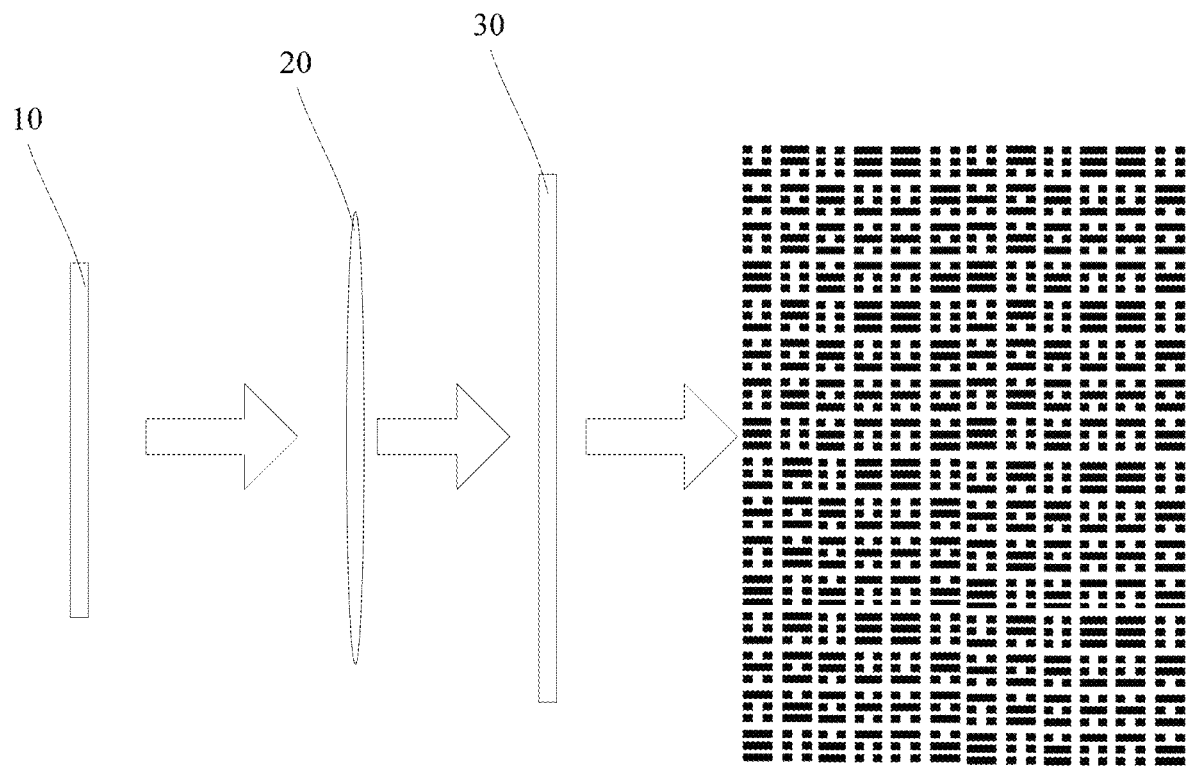

As shown in FIG. 13, the embodiment further provides an optical component including the pixel structure 10 of the vertical cavity surface emitting laser, the optical lens 20 disposed on the pixel structure 10, and the optical lens 20. The optical diffraction element 30 is used to achieve an enlarged projection of the pattern and a reproduction. The diffraction optical element 30 (DOE) can copy the pattern of the vertical cavity surface emitting laser into a large M*N matrix, which can copy hundreds of pixel structures into tens of thousands, which can increase the number of patterns by several times. Up to several hundred times, the optical component can be applied to face recognition and three-dimensional perception. The embodiment further provides an optical component comprising the pixel array of the vertical cavity surface emitting laser described above and the optical lens 20 disposed on the pixel array to achieve an enlarged projection of the pattern array.

As shown in FIG. 8a to FIG. 11, embodiments further provide a method for fabricating a pixel structure of a vertical cavity surface emitting laser, comprising the steps of: 1) forming a lower mirror 201 of a vertical cavity surface emitting laser, an active layer 202, and an upper mirror 203 defining an emission window 103 of the vertical cavity surface emitting laser; and 2) forming a pixel structure in the emission window 103 of the vertical cavity surface emitting laser, the pixel structure being included in the emission window 103 having a plurality of bright-area sub-pixels 101 having light emission and a plurality of dark-area sub-pixels 102 having no light emission, and the bright-area sub-pixel 101 and the dark-area sub-pixel 102 are in the emission window 103 arranged in a pattern.

An implementation process is shown in FIG. 8a to FIG. 8b, wherein FIG. 8b is a schematic cross-sectional structure of FIG. 8a at AA'. Step 2) includes: 2-1) a patterned trench 300 is etched into the lower mirror 201, the active layer 202 and the upper mirror 203. The sidewall of the trench 300 exposes the active layer 202; 2-2) from the sidewall of the trench 300, the sidewall of the vertical cavity surface emitting laser is oxidized to form a limiting oxide layer 301 in the vertical cavity surface emitting laser, the trench 300 and the limiting oxide layer 301 for cutting the vertical current path of the corresponding region. The vertical cavity omits a current path of the laser to form the dark region sub-pixel 102.

Another implementation is shown in FIG. 9a to FIG. 9b, wherein FIG. 9b is a schematic cross-sectional structure of FIG. 9a at B-B'. Step 2) includes: the lower mirror 201 or the upper mirror forming a patterned implant barrier layer in 203, the implant barrier layer implanting passivation ions to form ions in the lower mirror 201 and the active layer 202 or in the upper mirror 203 and the active layer 202. A passivation layer 310 is used to cut the current path of the vertical cavity surface emitting laser of the corresponding region to form the dark region sub-pixel 102.

In still another implementation, as shown in FIG. 10, step 2) includes: 2-1) depositing a metal layer on the upper mirror 203; 2-2) using a photolithography process and an etching process on the metal. A pattern is etched in the layer, and the remaining metal layer serves as a metal masking layer 320 for masking the light exit path of the vertical cavity surface emitting laser of the corresponding region to form the dark region sub-pixel 102.

In still another implementation, as shown in FIG. 11, step 2) includes etching the upper mirror 203 by a photolithography process and an etching process to form a patterned high threshold reflective layer 330 in the upper mirror 203. The high threshold reflective layer 330 is configured to increase a current intensity required for the light of the vertical cavity surface emitting laser to be emitted, such that the dark region sub-pixel 102 is formed without light emission.

As described above, the pixel structure of the vertical cavity surface emitting laser of the present invention and the manufacturing method thereof may have the following beneficial effects and characteristics:

1) Aspects of the invention form a plurality of bright-area sub-pixels having light emission and a plurality of dark-area sub-pixels having no light emission in the emission window of the vertical cavity surface emitting laser, forming a pattern directly in the emission window. In some embodiments, the current passes only in the area of the bright-area sub-pixels, and no current flows in the dark-area sub-pixel area, which can greatly improve the energy efficiency of the device and reduce the energy consumption of the device.

2) Aspects of the invention can form a pattern in the emission window of a vertical cavity surface emitting laser, such as a digital pattern, a letter pattern and a text pattern, a matrix pattern, a two-dimensional code pattern, etc., which greatly improves the portability of the vertical cavity surface emitting laser. Increased information density extends its range of applications.

3) Aspects of the invention are compatible with the fabrication process of the existing vertical cavity surface emitting laser, and do not require an additional external mask when displaying an image, which is advantageous for the reduction of manufacturing cost.

4) Each pixel structure in the pixel array of embodiments of the present invention can be independently identified without depending on the adjacent pixel structure, greatly enhancing the resolvability of the pixel array.

5) Aspects of the present invention can form a pixel array of a plurality of vertical cavity surface emitting lasers, wherein the pixel array includes not only position information of the pixel structure but also pattern information of the pixel structure. The group scheme and the coded structure optical module scheme can effectively reduce the energy consumption and manufacturing cost of the structural optical and the encoded optical unit optical module while maintaining a certain information density, or can be achieved under the same cost and energy consumption but with higher information density and recognizability.

Therefore, the present invention effectively overcomes various shortcomings in the prior art and has high industrial utilization value.

The above-described embodiments are merely illustrative of the principles of the invention and its effects, and are not intended to limit the invention. Modifications or variations of the above-described embodiments may be made by those skilled in the art without departing from the spirit and scope of the invention. Therefore, all equivalent modifications or changes made by those skilled in the art without departing from the spirit and scope of the invention are still to be covered by the appended claims.

What is claimed is:

1. A system comprising:
a plurality of vertical cavity surface emitting lasers, each with a permanently encoded pixel structure, each vertical cavity surface emitting laser comprising a lower mirror, an active layer, and an upper mirror, and having an emission window; wherein the permanently encoded pixel structure comprises one or more bright-area sub-pixels for which light is emitted through the emission window and one or more dark-area sub-pixels for which light is not emitted through the emission window, and the bright-area sub-pixels and dark-area sub-pixels are arranged to form a permanently encoded, digital, spatial pattern of light emission through the emission window; at least one dark-area sub-pixel comprises a surface relief structure located in the lower mirror or in the upper mirror, the surface relief structure comprising a high threshold reflective layer to suppress an optical mode within the dark-area sub-pixel so that light is not emitted through the emission window for the dark-area sub-pixel; at least one bright-area sub-pixel has a length of between 3 microns and 10 microns and a width of between 3 microns and 10 microns; and each vertical cavity surface emitting laser further comprising a ring electrode surrounding the emission window for conducting current through the vertical cavity surface emitting laser; and
an optical element positioned to project the digital spatial patterns of light from the plurality of vertical cavity surface emitting lasers.

2. The system of claim 1, wherein the bright-area and dark-area sub-pixels of each vertical cavity surface emitting laser are arranged in a matrix pattern.

3. The system of claim 1, wherein the bright-area and dark-area sub-pixels of each vertical cavity surface emitting laser are arranged in a text pattern or a letter pattern.

4. The system of claim 1, wherein the bright-area and dark-area sub-pixels of each vertical cavity surface emitting laser are arranged in a two-dimensional code pattern.

5. The system of claim 1, wherein the bright-area sub-pixels comprise a plurality of strip-shaped bright-area sub-pixels, and the dark-area sub-pixel(s) comprise areas between the bright-area sub-pixels.

6. The system of claim 5, wherein the bright-area sub-pixels comprise a plurality of strip-shaped bright-area sub-pixels of different lengths.

7. The system of claim 6, wherein the digital spatial pattern of light emission of each vertical cavity surface emitting laser forms a Pa Kua (Eight Trigram) symbol.

8. The system of claim 6, wherein the strip-shaped bright-area sub-pixels include one or more sub-pixels having a length of between 3 microns and 10 microns and a width of between 3 microns and 10 microns, and further include one or more sub-pixels having a length of between 10 microns and 30 microns and a width of between 3 microns and 10 microns; and the dark-area sub-pixel(s) have a width between 2 microns and 15 microns.

9. The system of claim 1, wherein at least one dark-area sub-pixel comprises an oxide layer extending from a sidewall of a trench, and the trench and the oxide layer block a current path within the dark-area sub-pixel so that light is not emitted through the emission window for the dark-area sub-pixel.

10. The system of claim 1, wherein at least one dark-area sub-pixel comprises an ion passivation layer that blocks a current path within the dark-area sub-pixel so that light is not emitted through the emission window for the dark-area sub-pixel.

11. The system of claim 1, wherein at least one dark-area sub-pixel comprises a metal masking layer that blocks a light exit path within the dark-area sub-pixel so that light is not emitted through the emission window for the dark-area sub-pixel.

12. The system of claim 1, wherein the vertical cavity surface emitting lasers are front-emitting.

13. The system of claim 1, wherein the vertical cavity surface emitting lasers are back-emitting.

14. An array of vertical cavity surface emitting lasers, each with a permanently encoded pixel structure, each vertical cavity surface emitting laser comprising a lower mirror, an active layer, and an upper mirror, and having an emission window; wherein the permanently encoded pixel structure for each vertical cavity surface emitting laser comprises one or more bright-area sub-pixels for which light is emitted through the emission window and one or more dark-area sub-pixel(s) for which light is not emitted through the emission window, and the bright-area sub-pixel(s) and the dark-area sub-pixel(s) are arranged to form a permanently encoded, digital, spatial pattern of light emission through the emission window; at least one dark-area sub-pixel comprises a surface relief structure located in the lower mirror or in the upper mirror, the surface relief structure comprising a high threshold reflective layer to suppress an optical mode within the dark-area sub-pixel so that light is not emitted through the emission window for the dark-area sub-pixel; at least one bright-area sub-pixel has a length of between 3 microns and 10 microns and a width of between 3 microns and 10 microns; and each vertical cavity surface emitting laser further comprises a ring electrode surrounding the emission window for conducting current through the vertical cavity surface emitting laser.

15. The array of vertical cavity surface emitting lasers of claim 14, wherein the array of vertical cavity surface emitting lasers encodes information based on the digital, spatial patterns of light emission for each vertical cavity surface emitting laser and on locations of the vertical cavity surface emitting lasers within the array.

16. The array of vertical cavity surface emitting lasers of claim 14, wherein the bright-area and dark-area sub-pixels for each vertical cavity surface emitting laser are arranged in a two-dimensional code pattern.

17. The array of vertical cavity surface emitting lasers of claim 14, wherein the bright-area and dark-area sub-pixels of the array encode information with an information density of at least $5 \times 10^3$ bits/mm$^2$.

18. The array of vertical cavity surface emitting lasers of claim 14, wherein the bright-area and dark-area sub-pixels of the array of vertical cavity surface emitting lasers encode information with an information density of at least $1 \times 10^5$ bits/mm$^2$.

\* \* \* \* \*